(12) United States Patent
Uehara

(10) Patent No.: US 11,579,519 B2
(45) Date of Patent: Feb. 14, 2023

(54) LIGHT SOURCE DEVICE, ILLUMINATION DEVICE, AND PROJECTOR

(71) Applicant: SEIKO EPSON CORPORATION, Tokyo (JP)

(72) Inventor: Katsuyuki Uehara, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 2 days.

(21) Appl. No.: 17/208,488

(22) Filed: Mar. 22, 2021

(65) Prior Publication Data

US 2021/0294196 A1    Sep. 23, 2021

(30) Foreign Application Priority Data

Mar. 23, 2020 (JP) .............................. JP2020-051711

(51) Int. Cl.
*G03B 21/20* (2006.01)
*H04N 9/31* (2006.01)
*G02B 27/28* (2006.01)

(52) U.S. Cl.
CPC ....... *G03B 21/2073* (2013.01); *G02B 27/283* (2013.01); *G03B 21/204* (2013.01); *G03B 21/2013* (2013.01); *G03B 21/2066* (2013.01); *H04N 9/3161* (2013.01); *H04N 9/3164* (2013.01); *H04N 9/3167* (2013.01)

(58) Field of Classification Search
CPC ............ G03B 21/2073; G03B 21/2013; G03B 21/204; G03B 21/2066; H04N 9/3161; H04N 9/3164; H04N 9/3167

USPC .......................................................... 353/20
See application file for complete search history.

(56) References Cited

U.S. PATENT DOCUMENTS

| | | |
|---|---|---|
| 2011/0187998 A1 | 8/2011 | Kimura et al. |
| 2012/0133904 A1 | 5/2012 | Akiyama |
| 2012/0140183 A1 | 6/2012 | Tanaka et al. |
| 2013/0222772 A1 | 8/2013 | Matsubara |
| 2017/0097562 A1 | 4/2017 | Wu |
| 2018/0074392 A1 | 3/2018 | Akiyama et al. |
| 2018/0373132 A1 | 12/2018 | Miyazaki |

(Continued)

FOREIGN PATENT DOCUMENTS

| | | |
|---|---|---|
| JP | 2007-114603 A | 5/2007 |
| JP | 2011-158502 A | 8/2011 |

(Continued)

*Primary Examiner* — Jerry L Brooks
(74) *Attorney, Agent, or Firm* — Oliff PLC

(57) ABSTRACT

A light source device according to the present disclosure includes a first light source section for emitting a first light flux, a second light source section for emitting a second light flux, a third light source section for emitting a third light flux, a first reflecting member, a second reflecting member for reflecting the second light flux, and a polarization combining element. With respect to the polarization combining element, the first light flux and the second light flux are light polarized in a first polarization direction, and the third light flux is light polarized in a second polarization direction, and the first and second reflecting members are disposed so that a distance between the first light flux and second light flux becomes smaller after incidence than before the incidence. The polarization combining element combines the first light flux, the second light flux, and the third light flux with each other.

15 Claims, 9 Drawing Sheets

(56) References Cited

U.S. PATENT DOCUMENTS

2019/0371971 A1   12/2019  Kozuru et al.
2019/0386192 A1   12/2019  Kozuru et al.
2021/0191250 A1*   6/2021  Kurita .................... G03B 33/12

FOREIGN PATENT DOCUMENTS

| | | |
|---|---|---|
| JP | 2012-118110 A | 6/2012 |
| JP | 2012-137744 A | 7/2012 |
| JP | 2015-179766 A | 10/2015 |
| JP | 2016-186585 A | 10/2016 |
| JP | 2017-516151 A | 6/2017 |
| JP | 2017-194494 A | 10/2017 |
| JP | 2017-194523 A | 10/2017 |
| JP | 2018-021990 A | 2/2018 |
| JP | 2019-008193 A | 1/2019 |
| JP | 2019-212752 A | 12/2019 |
| JP | 2019-220672 A | 12/2019 |
| WO | 2012/066654 A1 | 5/2012 |
| WO | 2016/080295 A1 | 5/2016 |

* cited by examiner

LIGHT SOURCE DEVICE, ILLUMINATION DEVICE, AND PROJECTOR

The present application is based on, and claims priority from JP Application Serial Number 2020-051711, filed Mar. 23, 2020, the disclosure of which is hereby incorporated by reference herein in its entirety.

BACKGROUND

1. Technical Field

The present disclosure relates to a light source device, an illumination device, and a projector.

2. Related Art

In the past, there is known a light source device which uses an afocal optical system as an optical system for compressing a beam width of a light flux emitted from a plurality of solid-state light source (see, e.g., JP-A-2012-137744). Further, there exists a light source device which uses a light source unit having a one-dimensional arrangement in which a plurality of semiconductor lasers arranged in a line (see, e.g., JP-A-2019-212752, JP-A-2019-220672).

For example, when the light flux from the light source device using a plurality of light source units each having the one-dimensional arrangement described above is compressed using the afocal optical system, in order to accept the whole of the light flux emitted from the light source device, a large-sized optical component becomes necessary, and growth in size and an increase in cost of the light source device are caused.

Therefore, there has been desired provision of emerging technology with which the light flux emitted from the light source device which uses the plurality of light source units having the one-dimensional arrangement described above can be compressed without using the afocal optical system.

SUMMARY

In view of the problems described above, according to a first aspect of the present disclosure, there is provided a light source device including a first light source section which has a plurality of first light emitting elements arranged in sequence in a row along a first direction, and which is configured to emit a first light flux, a second light source section which has a plurality of second light emitting elements arranged in sequence in a row along the first direction, and which is configured to emit a second light flux, a third light source section which has a plurality of third light emitting elements arranged in sequence in a row along a second direction crossing the first direction, and which is configured to emit a third light flux, a first reflecting member configured to reflect the second light flux toward a direction crossing an emission direction of the second light flux and the first direction, a second reflecting member configured to reflect the second light flux reflected by the first reflecting member toward an emission direction of the first light flux, and a polarization combining element which the first light flux, the second light flux reflected by the second reflecting member, and the third light flux enter, which is configured to reflect one of the first light flux and the second light flux reflected by the second reflecting member, and the third light flux, and which is configured to transmit another of the first light flux and the second light flux reflected by the second reflecting member, and the third light flux, wherein with respect to the polarization combining element, the first light flux and the second light flux reflected by the second reflecting member are light polarized in a first polarization direction, and the third light flux is light polarized in a second polarization direction different from the first polarization direction, the first reflecting member and the second reflecting member are disposed so that a distance between the first light flux and the second light flux becomes smaller after incidence to the first reflecting member and the second reflecting member than before the incidence, and the polarization combining element combines the first light flux, the second light flux reflected by the second reflecting member, and the third light flux with each other.

According to a second aspect of the present disclosure, there is provided a light source device including a first light source section which has a plurality of first light emitting elements arranged in sequence in a row along a first direction, and which is configured to emit a first light flux, a second light source section which has a plurality of second light emitting elements arranged in sequence in a row along the first direction, and which is configured to emit a second light flux, a third light source section which has a plurality of third light emitting elements arranged in sequence in a row along a second direction crossing the first direction, and which is configured to emit a third light flux, a first reflecting member configured to reflect the first light flux toward a direction crossing an emission direction of the first light flux and the first direction, a second reflecting member configured to reflect the second light flux toward a direction crossing an emission direction of the second light flux and the first direction, and a polarization combining element which the first light flux reflected by the first reflecting member, the second light flux reflected by the second reflecting member, and the third light flux enter, which is configured to reflect one of the first light flux reflected by the first reflecting member and the second light flux reflected by the second reflecting member, and the third light flux, and which is configured to transmit another of the first light flux reflected by the first reflecting member and the second light flux reflected by the second reflecting member, and the third light flux, wherein with respect to the polarization combining element, the first light flux reflected by the first reflecting member and the second light flux reflected by the second reflecting member are light polarized in a first polarization direction, and the third light flux is light polarized in a second polarization direction different from the first polarization direction, the first reflecting member and the second reflecting member are disposed so that a distance between the first light flux and the second light flux becomes smaller after incidence to the first reflecting member and the second reflecting member than before the incidence, and the polarization combining element combines the first light flux reflected by the first reflecting member, the second light flux reflected by the second reflecting member, and the third light flux with each other.

According to a third aspect of the present disclosure, there is provided an illumination device including the light source device according to one of the first aspect or the second aspect, a wavelength conversion element configured to perform wavelength conversion on the light from the light source device, and a reflecting member configured to reflect the light from the light source device toward the wavelength conversion element, wherein the reflecting member is disposed on a light path of light emitted from the wavelength conversion element.

According to a fourth aspect of the present disclosure, there is provided a projector including the illumination device according to the third aspect of the present disclosure, a light modulation device configured to modulate the light from the illumination device in accordance with image information, and a projection optical device configured to project the light modulated by the light modulation device.

DESCRIPTION OF EXEMPLARY EMBODIMENTS

A first embodiment of the present disclosure will hereinafter be described using the drawings.

A projector according to the present embodiment is an example of a projector using liquid crystal panels as light modulation devices.

It should be noted that in each of the drawings described below, the constituents are shown with the scale ratios of respective sizes set differently between the constituents in some cases in order to facilitate the visualization of each of the constituents.

Figure 1:
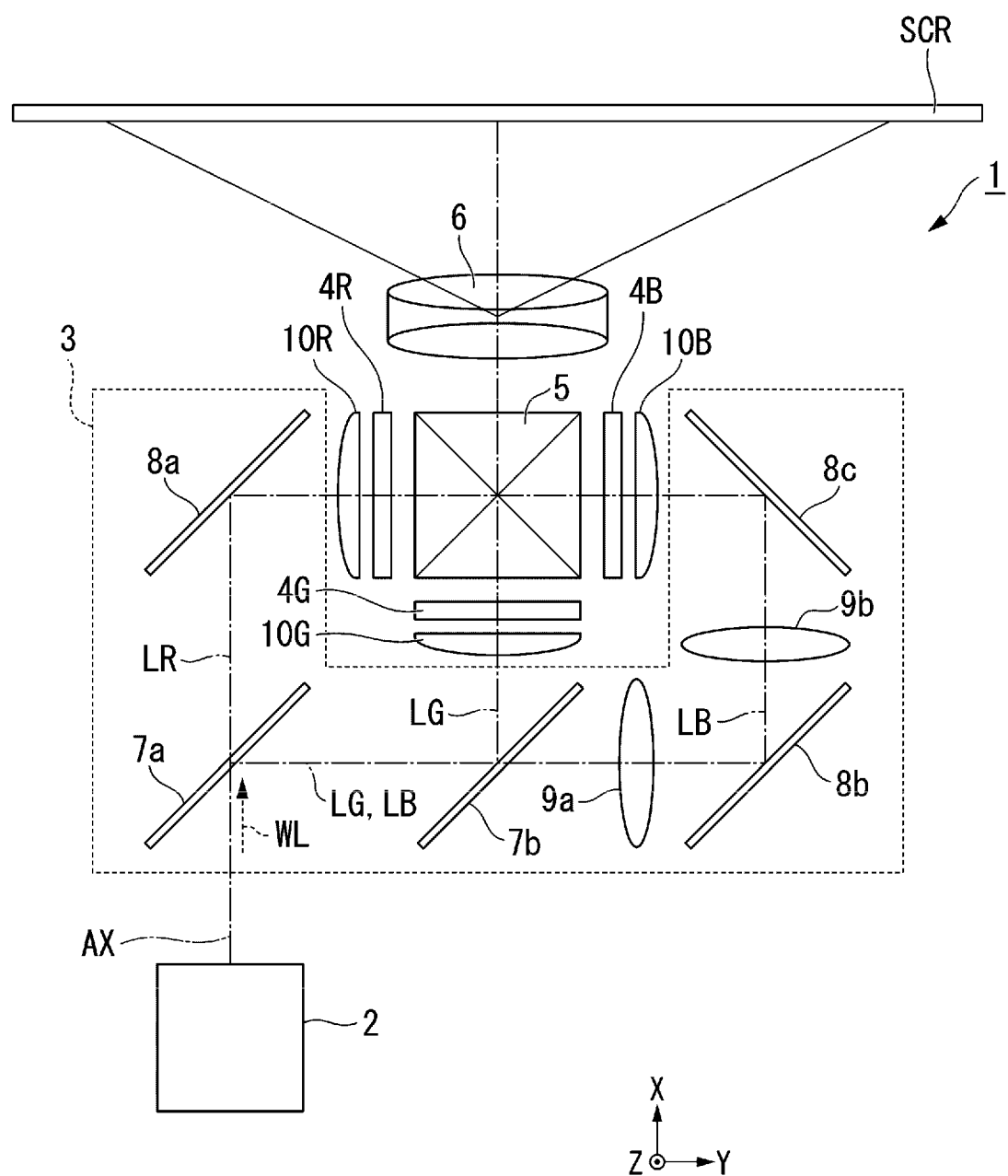
FIG. 1 is a diagram showing a configuration of a projector according to a first embodiment.

FIG. 1 is a diagram showing a configuration of the projector according to the present embodiment.

The projector 1 according to the present embodiment shown in FIG. 1 is a projection-type image display device for displaying a color image on a screen (a projection target surface) SCR. The projector 1 uses three light modulation devices corresponding to respective colored light beams, namely red light LR, green light LG, and blue light LB.

The projector 1 is provided with an illumination device 2, a color separation optical system 3, a light modulation device 4R, a light modulation device 4G, a light modulation device 4B, a combining optical system 5, and a projection optical device 6.

The illumination device 2 emits illumination light WL having a white color toward the color separation optical system 3. The color separation optical system 3 separates the illumination light WL having a white color into the red light LR, the green light LG, and the blue light LB. The color separation optical system 3 is provided with a first dichroic mirror 7a, a second dichroic mirror 7b, a first reflecting mirror 8a, a second reflecting mirror 8b, a third reflecting mirror 8c, a first relay lens 9a, and a second relay lens 9b.

The first dichroic mirror 7a separates the illumination light WL from the illumination device 2 into the red light LR and the other light (the green light LG and the blue light LB). The first dichroic mirror 7a transmits the red light LR thus separated from, and at the same time reflects the other light (the green light LG and the blue light LB). Meanwhile, the second dichroic mirror 7b separates the other light into the green light LG and the blue light LB. The second dichroic mirror 7b reflects the green light LG thus separated from and transmits the blue light LB.

The first reflecting mirror 8a is disposed in the light path of the red light LR, and the red light LR which has been transmitted through the first dichroic mirror 7a is reflected by the first reflecting mirror 8a toward the light modulation device 4R. Meanwhile, the second reflecting mirror 8b and the third reflecting mirror 8c are disposed in the light path of the blue light LB, and the blue light LB which has been transmitted through the second dichroic mirror 7b is reflected by the second reflecting mirror 8b and the third reflecting mirror 8c toward the light modulation device 4B. Further, the green light LG is reflected by the second dichroic mirror 7b toward the light modulation device 4G.

The first relay lens 9a and the second relay lens 9b are disposed at the light exit side of the second dichroic mirror 7b in the light path of the blue light LB. The first relay lens 9a and the second relay lens 9b correct a difference in illuminance distribution of the blue light LB due to the fact that the blue light LB is longer in optical path length than the red light LR and the green light LG.

The light modulation device 4R modulates the red light LR in accordance with image information to form image light corresponding to the red light LR. The light modulation device 4G modulates the green light LG in accordance with the image information to form image light corresponding to the green light LG. The light modulation device 4B modulates the blue light LB in accordance with the image information to form image light corresponding to the blue light LB.

As the light modulation device 4R, the light modulation device 4G, and the light modulation device 4B, there are used, for example, transmissive liquid crystal panels. Further, at the incident side and the exit side of the liquid crystal panel, there are disposed polarization plates (not shown), respectively, and thus, there is formed a configuration of transmitting only the linearly polarized light with a specific direction.

At the incident side of the light modulation device 4R, the light modulation device 4G, and the light modulation device 4B, there are disposed a field lens 10R, a field lens 10G, and a field lens 10B, respectively. The field lens 10R, the field lens 10G, and the field lens 10B collimate principal rays of the red light LR, the green light LG, and the blue light LB which enter the light modulation device 4R, the light modulation device 4G, and the light modulation device 4B, respectively.

The combining optical system 5 combines the image light corresponding respectively to the red light LR, the green light LG, and the blue light LB with each other in response to incidence of the image light respectively emitted from the light modulation device 4R, the light modulation device 4G, and the light modulation device 4B, and then emits the image light thus combined toward the projection optical device 6. As the combining optical system 5, there is used, for example, a cross dichroic prism.

The projection optical device 6 is constituted by a plurality of projection lenses. The projection optical device 6 projects the image light having been combined by the combining optical system 5 toward the screen SCR in an enlarged manner. Thus, an image is displayed on the screen SCR.

An example of the illumination device 2 according to the present embodiment will be described.

Figure 2:
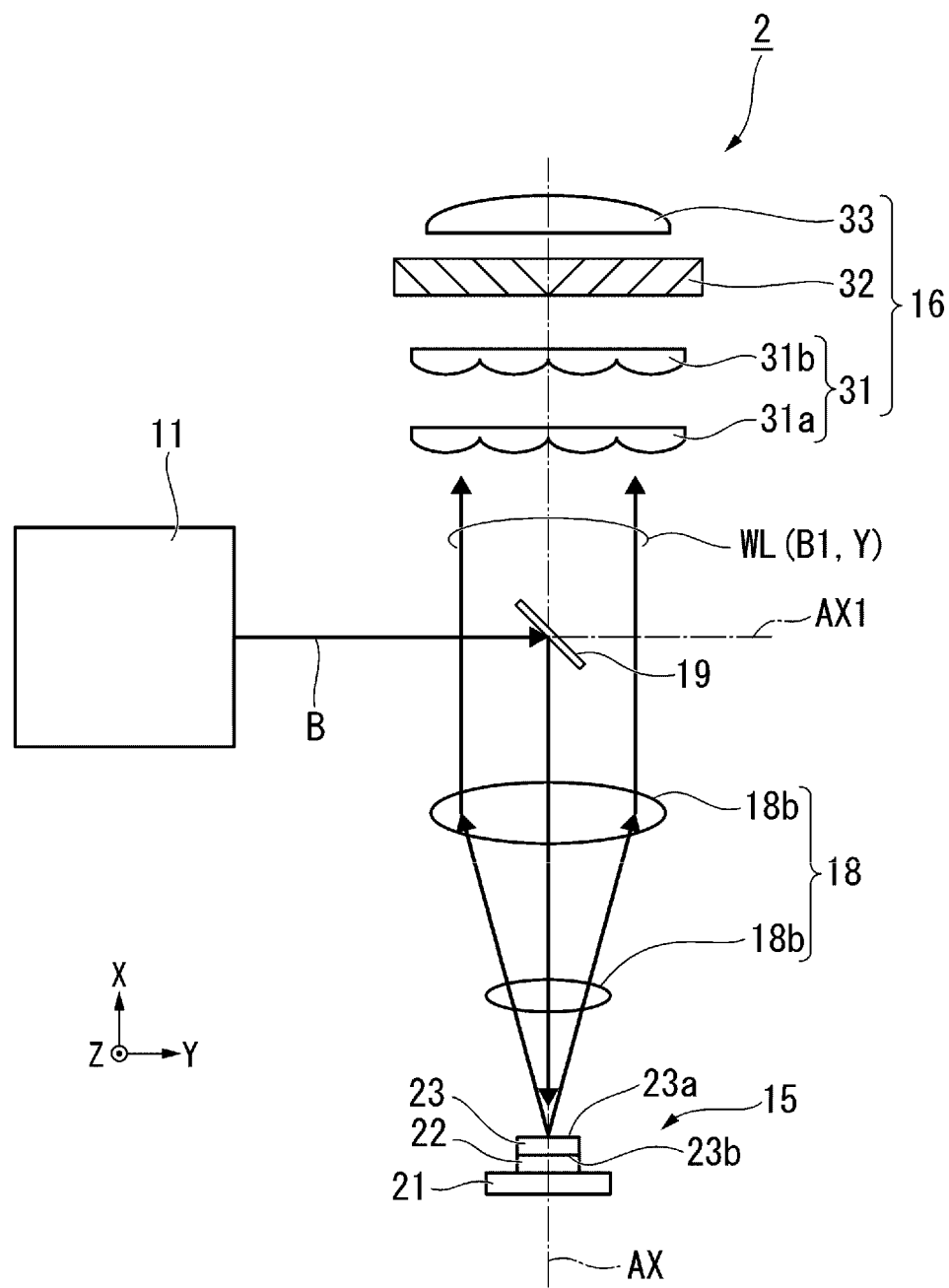
FIG. 2 is a diagram showing a schematic configuration of an illumination device.

FIG. 2 is a diagram showing a schematic configuration of the illumination device 2.

As shown in FIG. 2, the illumination device 2 is provided with a light source device 11, a wavelength conversion element 15, a homogenized illumination optical system 16, a light collection optical system 18, and a dichroic mirror (a reflecting member) 19.

An arrangement and so on of the constituents of the illumination device 2 and the light source device 11 will hereinafter be described using an XYZ orthogonal coordinate system. In the present embodiment, a direction along an illumination light axis AX in the illumination device 2 is defined as an X-axis direction, a direction along a first light axis AX1 of the light source device 11 is defined as a Y-axis direction, and a direction perpendicular to the X axis and the Y axis is defined as a Z-axis direction. The first light axis AX1 and the illumination light axis AX are perpendicular to each other.

The light source device 11 and the dichroic mirror 19 are arranged along the first light axis AX1. The wavelength conversion element 15, the light collection optical system. 18, the dichroic mirror 19, and the homogenized illumination optical system 16 are disposed along the illumination light axis AX of the illumination device 2.

The first light B emitted from the light source device 11 enters the dichroic mirror 19. As described later, in the light source device 11 according to the present embodiment, the size of the dichroic mirror 19 is reduced in order to realize a state in which the light beam width of the first light B is reduced.

It should be noted that it is also possible to dispose a convex lens between the light source device 11 and the dichroic mirror 19 to make the first light B enter the dichroic mirror 19 in a condensed state. In this case, the dichroic mirror 19 is disposed at a focal point of the convex lens or in the vicinity of the focal point. By making the first light B enter the dichroic mirror 19 in the condensed state as described above, it is possible to further reduce the size of the dichroic mirror 19.

The dichroic mirror 19 has an optical characteristic of reflecting the first light B having a first wavelength band and transmitting second light Y which is emitted from a wavelength conversion element 15 described later, and which has a second wavelength band. The dichroic mirror 19 is formed of a dielectric multilayer film.

The first light B reflected by the dichroic mirror 19 enters the light collection optical system 18. The light collection optical system 18 includes convex lenses 18a, 18b to collect the first light B and make the first light B enter the wavelength conversion element 15.

It should be noted that it is also possible to use a mirror which reflects the first light B having the first wavelength band and the second light Y having the second wavelength band instead of the dichroic mirror 19. Further, it is also possible for the dichroic mirror 19 to have an optical characteristic of transmitting the first light B having the first wavelength band and reflecting the second light Y which is emitted from the wavelength conversion element 15, and which has the second wavelength band.

The wavelength conversion element 15 is provided with a substrate 21, a reflecting layer 22, and a wavelength conversion layer 23. The substrate 21 is a support substrate for supporting the reflecting layer 22 and the wavelength conversion layer 23, and is further a radiation substrate for radiating heat transferred from the wavelength conversion layer 23. The substrate 21 can be formed of a material having high thermal conductivity such as metal or ceramics.

The reflecting layer 22 is located between the substrate 21 and the wavelength conversion layer 23, and reflects the light entering the reflecting layer 22 from the wavelength conversion layer 23 toward the wavelength conversion layer 23. The reflecting layer 22 is formed of a laminated film including a dielectric multilayer film, a metal mirror, a reflection enhancing film, and so on.

The wavelength conversion layer 23 is disposed on the reflecting layer 22. The wavelength conversion layer 23 has an upper surface 23a which the first light B enters, and a lower surface 23b different from the upper surface 23a. The wavelength conversion layer 23 converts the first light B in the first wavelength band into the second light Y having the second wavelength band different from the first wavelength band.

The wavelength conversion layer 23 can include a ceramic phosphor, or can also include a single crystal phosphor. The second wavelength band is in a range of, for example, 500 through 680 nm. Therefore, the second light Y is yellow light including a green light component and a red light component.

The wavelength conversion layer 23 includes, for example, yttrium aluminum garnet (YAG) type phosphor. Citing YAG:Ce including cerium (Ce) as an activator agent as an example, as the wavelength conversion layer 23, there can be used a material obtained by mixing raw powder including constituent elements such as $Y_2O_3$, $Al_2O_3$, and $CeO_3$ to cause the solid-phase reaction, Y—Al—O amorphous particles obtained by a wet process such as a coprecipitation process or a sol-gel process, and YAG particles obtained by a gas-phase process such as a spray drying process, a flame heat decomposition process, or a thermal plasma process. It should be noted that it is desirable to use a porous sintered body as the wavelength conversion layer 23 from a viewpoint of light use efficiency, since in that case, the light is scattered inside the phosphor, and is difficult to propagate toward the lateral direction.

In the present embodiment, the upper surface 23a of the wavelength conversion layer 23 is provided with a scattering structure (not shown) for scattering a part of the first light B.

According to the wavelength conversion element 15 related to the present embodiment having the configuration described above, the illumination light WL having a white color and including the second light Y generated in the wavelength conversion layer 23 and diffusely reflected light B1 formed of a part of the first light B having diffusely been reflected by the upper surface 23a of the wavelength conversion layer 23 is emitted toward the light collection optical system 18. The illumination light WL is substantially collimated by the light collection optical system 18. The illumination light WL having been transmitted through the light collection optical system 18 passes through the dichroic mirror 19 disposed on the illumination light axis AX.

Here, the dichroic mirror 19 has an optical characteristic of reflecting the first light B and at the same time transmitting the second light Y. Therefore, the second light Y included in the illumination light WL is transmitted through the dichroic mirror 19, and then proceeds toward the homogenized illumination optical system 16. Since the second light Y is transmitted through the dichroic mirror 19, it is possible to reduce the light loss of the second light Y due to the dichroic mirror 19.

On the other hand, the diffusely reflected light B1 included in the illumination light WL is the light the same in wavelength band as the first light B, and is therefore reflected by the dichroic mirror 19. In contrast, in the present embodiment, by making the first light B enter the dichroic mirror 19 in the condensed state, the dichroic mirror 19 is reduced in size. Therefore, since the incident light intensity of the diffusely reflected light B1 to the dichroic mirror 19 is suppressed, it is possible to reduce the light loss of the diffusely reflected light B1 caused by being reflected by the dichroic mirror 19.

The homogenized illumination optical system 16 which the illumination light WL enters includes an integrator optical system 31, a polarization conversion element 32, and a superimposing optical system 33. The integrator optical system 31 is provided with a first multi-lens array 31*a* and a second multi-lens array 31*b*.

The polarization conversion element 32 is constituted by polarization split films and wave plates arranged in an array. The polarization conversion element 32 uniforms the polarization direction of the illumination light WL into a predetermined direction. Specifically, the polarization conversion element 32 uniforms the polarization direction of the illumination light WL into a direction of a transmission axis of the incident side polarization plate of each of the light modulation devices 4R, 4G, and 4B.

Thus, the polarization direction of the red light LR, the green light LG, and the blue light LB obtained by separating the illumination light WL having been transmitted through the polarization conversion element 32 coincides with the transmission axis direction of the incident side polarization plate of each of the light modulation devices 4R, 4G, and 4B. Therefore, the red light LR, the green light LG, and the blue light LB enter the image formation areas of the light modulation devices 4R, 4G, and 4B, respectively, without being blocked by the incident side polarization plates, respectively.

The superimposing optical system 33 forms images of the respective small lenses of the first multi-lens array 31*a* in the vicinity of each of the image formation areas of the respective light modulation devices 4R, 4G, and 4B in cooperation with the second multi-lens array 31*b*.

According to the illumination device 2 related to the present embodiment, it is possible to increase the light use efficiency of the illumination light WL, and thus, it is possible to increase the luminance of the illumination light WL and reduce the power consumption, or suppress heat generation in the device due to the light loss.

Figure 3:
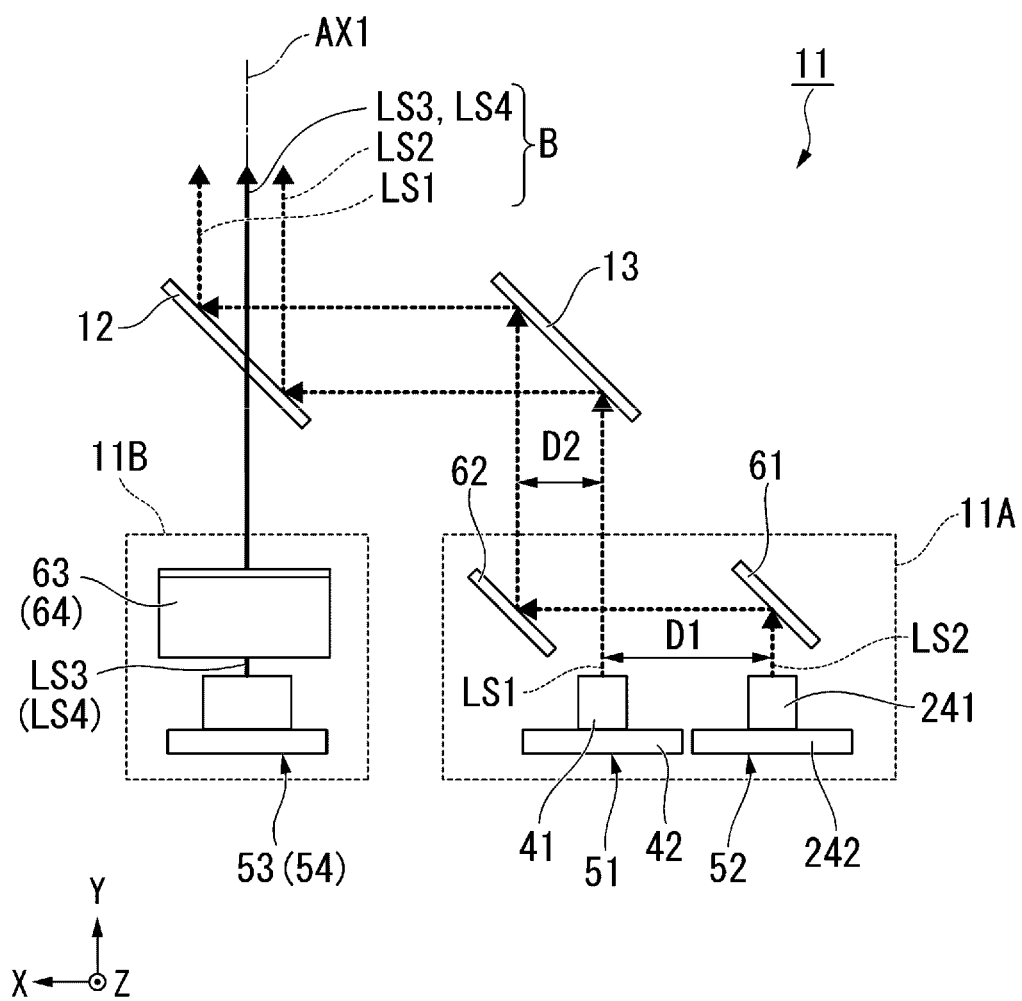
FIG. 3 is a plan view showing an overall configuration of a light source device.

Here, a configuration of the light source device 11 will be described. FIG. 3 is a plan view of an overall configuration of the light source device 11 viewed from the +Z side toward the −Z side.

As shown in FIG. 3, the light source device 11 according to the present embodiment is provided with a first light source unit 11A, a second light source unit 11B, a polarization combining element 12, and a reflecting mirror (a fifth reflecting member) 13.

The first light source unit 11A has a first light source section 51, a second light source section 52, a reflecting mirror (a first reflecting member) 61, and a reflecting mirror (a second reflecting member) 62. The first light source section 51 emits a first light flux LS1 toward the Y-axis direction. The second light source section 52 emits a second light flux LS2 toward the Y-axis direction.

Here, the first light source section 51 and the second light source section 52 have the same configuration. The configuration of the light source section will hereinafter be described citing the first light source section 51 as an example.

Figure 4:
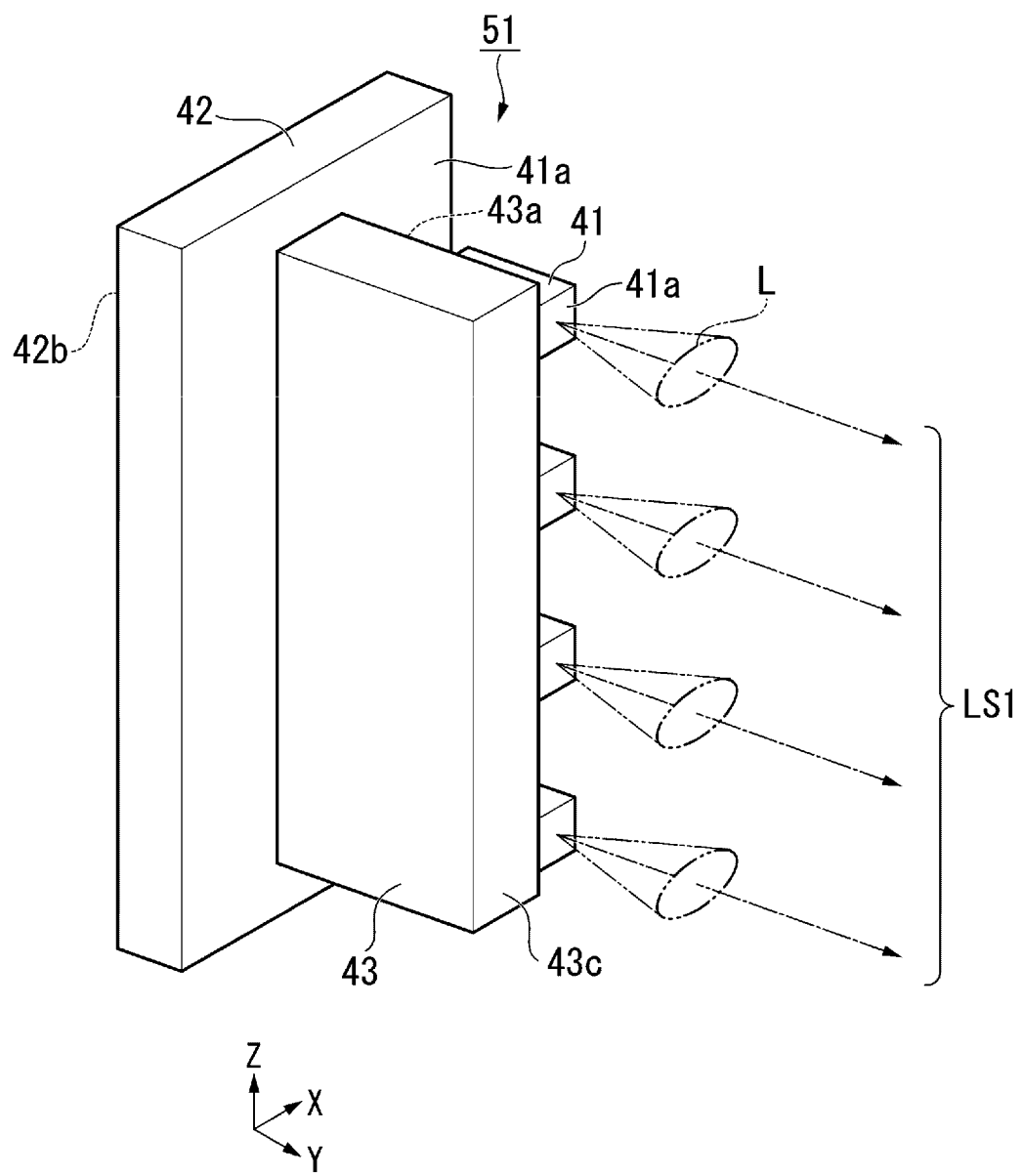
FIG. 4 is a perspective view of a first light source section.

FIG. 4 is a perspective view of the first light source section 51.

As shown in FIG. 4, the first light source section 51 is provided with a plurality of light emitting elements (first light emitting elements) 41, a substrate (a first substrate) 42, and a support member 43.

The substrate 42 has a first surface 41*a* and a second surface 42*b*, and is formed of a metal material excellent in radiation performance such as aluminum or copper. The support member 43 is provided to the first surface 42*a* of the substrate 42. Similarly to the substrate 42, the support member 43 is formed of a metal material excellent in radiation performance such as aluminum or copper. The support member 43 has a mounting surface 43*a* on which a plurality of light emitting elements 41 is mounted. The mounting surface 43*a* has a rectangular shape having a longitudinal direction and a short-side direction viewed from the normal direction of the mounting surface 43*a*.

The plurality of light emitting elements 41 is arranged on the mounting surface 43*a* of the support member 43 at intervals along the longitudinal direction of the mounting surface 43*a*. The plurality of light emitting elements 41 is supported by the substrate 42 via the support member 43. In the present embodiment, the first light source section 51 has the plurality of (five in the present embodiment) light emitting elements 41 arranged in sequence in a line along the Z-axis direction (a first direction). The emission direction of a light beam L is a direction along a principal ray of the light beam L.

Each of the light emitting elements 41 is mounted on the support member 43 so that a light emitting surface 41*a* having a rectangular shape is located on substantially the same plane as an end surface 43*c* along the long side of the support member 43. Therefore, the emission direction of the light beam L emitted from each of the light emitting elements 41 coincides with the short-side direction of the support member 43. Further, the arrangement direction of the plurality of light emitting elements 41 crosses the emission direction of the light beam L. A shape of a cross-sectional surface perpendicular to the principal ray of the light beam L emitted from each of the light emitting elements 41 is an ellipse. The short-axis direction of the ellipse coincides with the arrangement direction (the Z-axis direction) of the plurality of light emitting elements 41. The long axis direction of the ellipse coincides with the X-axis direction. It should be noted that the shape of the cross-sectional surface perpendicular to the principal ray of the light beam L emitted from each of the light emitting elements 41 is not required to be a completely elliptical shape.

Each of the light emitting elements 41 is formed of a blue semiconductor laser for emitting a blue light beam. The blue semiconductor laser emits the blue light beam having a peak wavelength in a wavelength band of, for example, 380 nm through 495 nm. The light beam L emitted from each of the light emitting elements 41 is collimated by a collimator lens (not shown) disposed in the vicinity of the light emitting surface 41*a*.

Therefore, the first light source section 51 emits the light flux including four blue light beams L arranged side by side in the Z-axis direction. In the present embodiment, the whole of the light including the four light beams L emitted from the first light source section 51 is referred to as the first light flux LS1.

In the present embodiment, the first light flux LS1 to be emitted from the first light source section 51 is S-polarized light (light polarized in the first direction) with respect to the polarization combining element 12.

The second light source section 52 having the same configuration as that of the first light source section 51 includes a plurality of light emitting elements (second light emitting elements) 241 arranged side by side in the Z-axis direction, and a substrate (a second substrate) 242. Here, the light emitting elements 241 and the substrate 242 have the same configurations as those of the light emitting elements 41 and the substrate 42 of the first light source section 51, respectively.

The first light source section 51 and the second light source section 52 are disposed so that the respective substrates 42, 242 are parallel to the Z-X plane (a predetermined plane). In other words, the respective substrates 42, 242 of the first light source section 51 and the second light source section 52 are disposed on the same plane.

In the second light source section 52, a shape of a cross-sectional surface perpendicular to the principal ray of the light beam emitted from each of the light emitting elements 242 is an ellipse. The short-axis direction of the ellipse coincides with the arrangement direction (the Z-axis direction) of the plurality of light emitting elements 241.

The second light source section 52 emits light beams including four blue light beams arranged side by side in the Z-axis direction. In the present embodiment, the whole of the light including the four blue light beams emitted from the second light source section 52 is referred to as the second light flux LS2.

In the present embodiment, the second light flux LS2 to be emitted from the second light source section 52 is S-polarized light (light polarized in the first direction) with respect to the polarization combining element 12.

As shown in FIG. 3, the reflecting mirror 61 reflects the second light flux LS2 to be emitted from the second light source section 52 toward the X-axis direction crossing the Y-axis direction as the emission direction of the second light flux LS2 and the Z-axis direction (the first direction). Specifically, the second light flux LS2 is reflected by the reflecting mirror 61 toward the reflecting mirror 62.

The second light flux LS2 reflected by the reflecting mirror 61 is reflected by the reflecting mirror 62 toward the Y-axis direction as the emission direction of the first light flux LS1 emitted from the first light source section 51. In the present embodiment, the reflecting mirror 62 is disposed at the +X side of the first light source section 51. It should be noted that the reflecting mirror 61 and the reflecting mirror 62 are each formed of, for example, a plate-like member provided with a film made of a metal film or a dielectric multilayer film.

The first light flux LS1 emitted from the first light source section 51 directly enters a reflecting mirror 13. The reflecting mirror 13 is formed of, for example, a plate-like member provided with a film made of a metal film or a dielectric multilayer film. The second light flux LS2 reflected by the reflecting mirror 62 enters the reflecting mirror 13. In other words, the second light flux LS2 reflected by the reflecting mirror 62 and the first light flux LS1 emitted from the first light source section 51 enter the reflecting mirror 13.

The reflecting mirror 13 reflects the first light flux LS1 and the second light flux LS2 toward the polarization combining element 12. The first light flux LS1 and the second light flux LS2 reflected by the reflecting mirror 13 enter the polarization combining element 12 from the X-axis direction.

Here, a distance between the first light flux LS1 and the second light flux LS2 along the X-axis direction before entering the reflecting mirrors 61, 62 is referred to as a first distance D1, and a distance between the first light flux LS1 and the second light flux LS2 along the X-axis direction after entering the reflecting mirrors 61, 62 is referred to as a second distance D2.

In the light source device 11 according to the present embodiment, the reflecting mirrors 61, 62 are disposed so that the second distance D2 after the incidence to the reflecting mirrors 61, 62 is smaller than the first distance D1 before the incidence thereto regarding the distance between the first light flux LS1 and the second light flux LS2.

Specifically, the second light flux LS2 reflected by the reflecting mirror 61 crosses the first light flux LS1 emitted from the first light source section 51, and is then reflected by the reflecting mirror 62. The reflecting mirror 62 is disposed at the position where the second distance D2 described above becomes smaller than the first distance D1 described above.

The first light flux LS1 and the second light flux LS2 enter the polarization combining element 12 in a state in which the distance between them is reduced in the Y-axis direction. In the light source device 11 according to the present embodiment, the polarization combining element 12 can be reduced in size in the Y-axis direction.

The polarization combining element 12 is formed of an optical element having a polarization split function with respect to the blue light. The polarization combining element 12 has the polarization split function of reflecting the S-polarization component with respect to the blue light and transmitting the P-polarization component. In the present embodiment, the first light flux LS1 emitted from the first light source section 51 and the second light flux LS2 reflected by the reflecting mirror 62 enter the polarization combining element 12 as the S-polarized light. Therefore, the first light flux LS1 and the second light flux LS2 are reflected by the polarization combining element 12, and are then emitted toward the Y-axis direction.

Figure 5:
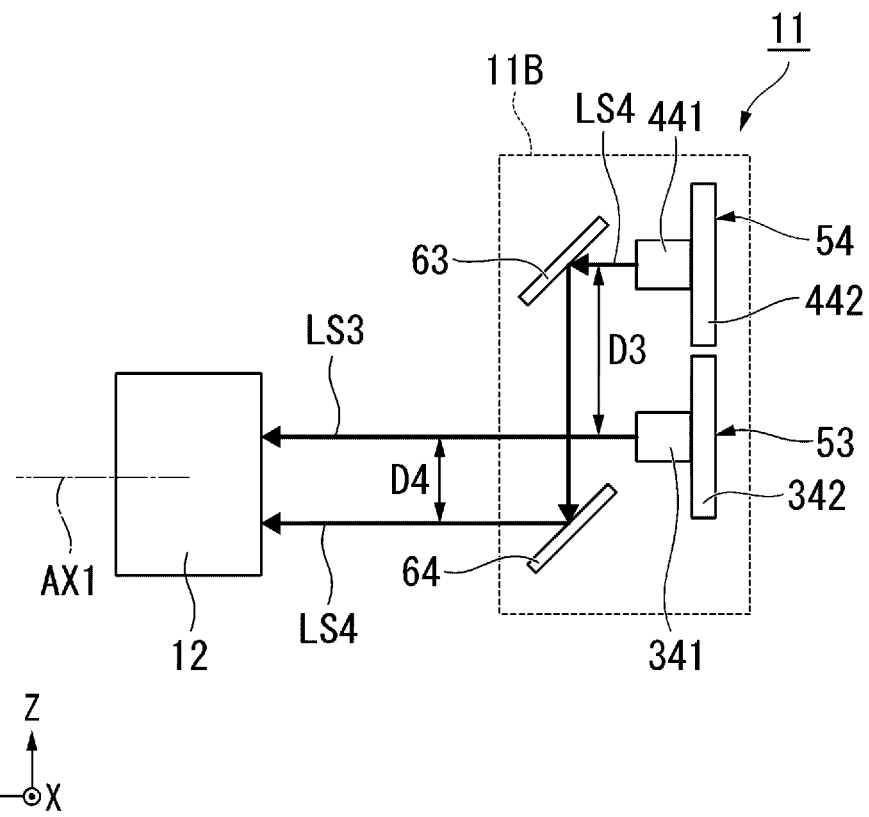
FIG. 5 is a diagram showing a configuration of a second light source unit.

Then, a configuration of the second light source unit 11B will be described. FIG. 5 is a diagram showing a configuration of the second light source unit 11B, and is a plan view of the second light source unit 11B viewed from the +X side toward the −X side.

As shown in FIG. 5, the second light source unit 11B has a third light source section 53, a fourth light source section 54, a reflecting mirror (a third reflecting member) 63, and a reflecting mirror (a fourth reflecting member) 64. The third light source section 53 emits a third light flux LS3 toward the Y-axis direction. The fourth light source section 54 emits a fourth light flux LS4 toward the Y-axis direction.

The third light source section 53 and the fourth light source section 54 each have the same configuration as that of the first light source section 51, and are arranged side by side in the Z-axis direction.

The third light source section 53 includes a plurality of light emitting elements (third light emitting elements) 341 arranged in sequence in a line along the X-axis direction (the second direction), and a substrate (a third substrate) 342. Here, the light emitting elements 341 and the substrate 342 have the same configurations as those of the light emitting elements 41 and the substrate 42 of the first light source section 51, respectively.

Specifically, the X-axis direction (the second direction) as the arrangement direction of the plurality of light emitting elements 341 in the third light source section 53 crosses (orthogonally) the Z-axis direction (the first direction) as the arrangement direction of the plurality of light emitting elements 41, 241 in the first light source section 51 and the second light source section 52.

A shape of a cross-sectional surface perpendicular to the principal ray of the light beam emitted from each of the light emitting elements 341 of the third light source section 53 is an ellipse. The short-axis direction of the ellipse coincides with the arrangement direction (the X-axis direction) of the plurality of light emitting elements 341. The third light source section 53 emits light beams including four blue light beams arranged side by side in the X-axis direction. In the present embodiment, the whole of the light including the four blue light beams emitted from the third light source section 53 is referred to as the third light flux LS3.

Further, the fourth light source section 54 includes a plurality of light emitting elements 441 arranged in sequence in a line along the X-axis direction, and a substrate 442. Here, the light emitting elements 441 and the substrate 442 have the same configurations as those of the light emitting elements 41 and the substrate 42 of the first light source section 51, respectively.

Specifically, the X-axis direction (the second direction) as the arrangement direction of the plurality of light emitting elements 441 in the fourth light source section 54 crosses (orthogonally) the Z-axis direction (the first direction) as the arrangement direction of the plurality of light emitting elements 41, 241 in the first light source section 51 and the second light source section 52.

A shape of a cross-sectional surface perpendicular to the principal ray of the light beam emitted from each of the light emitting elements 441 of the fourth light source section 54 is an ellipse. The short-axis direction of the ellipse coincides with the arrangement direction (the X-axis direction) of the plurality of light emitting elements 441. The fourth light source section 54 emits light beams including four blue light beams arranged side by side in the X-axis direction. In the present embodiment, the whole of the light including the four blue light beams emitted from the fourth light source section 54 is referred to as the fourth light flux LS4.

In the present embodiment, the third light source section 53 and the fourth light source section 54 are disposed so that the respective substrates 342, 442 are parallel to the Z-X plane (a predetermined plane).

Therefore, in the light source device 11 according to the present embodiment, the respective substrates 42, 242, 342, and 442 of the first light source section 51, the second light source section 52, the third light source section 53, and the fourth light source section 54 are disposed on the same plane. Therefore, it becomes possible to, for example, supply a cooling wind from one direction to each of the substrates 42, 242, 342, and 442. Therefore, it becomes easy to cool the first light source section 51, the second light source section 52, the third light source section 53, and the fourth light source section 54.

In the present embodiment, the third light flux LS3 to be emitted from the third light source section 53 and the fourth light flux LS4 to be emitted from the fourth light source section 54 are each P-polarized light (light polarized in the second direction) with respect to the polarization combining element 12.

The reflecting mirror 63 reflects the fourth light flux LS4 to be emitted from the fourth light source section 54 toward the Z-axis direction crossing the Y-axis direction as the emission direction of the fourth light flux LS4 and the X-axis direction (the second direction). Specifically, the fourth light flux LS4 is reflected by the reflecting mirror 63 toward the reflecting mirror 64.

The fourth light flux LS4 reflected by the reflecting mirror 63 is reflected by the reflecting mirror 64 toward the Y-axis direction as the emission direction of the third light flux LS3 emitted from the third light source section 53. It should be noted that the reflecting mirror 63 and the reflecting mirror 64 are each formed of, for example, a plate-like member provided with a film made of a metal film or a dielectric multilayer film.

The third light flux LS3 emitted from the third light source section 53 directly enters the polarization combining element 12. The fourth light flux LS4 reflected by the reflecting mirror 64 enters the polarization combining element 12. In other words, the fourth light flux LS4 reflected by the reflecting mirror 64 and the third light flux LS3 emitted from the third light source section 53 enter the polarization combining element 12.

Here, a distance between the third light flux LS3 and the fourth light flux LS4 along the Z-axis direction before entering the reflecting mirrors 63, 64 is referred to as a third distance D3, and a distance between the third light flux LS3 and the fourth light flux LS4 along the Z-axis direction after entering the reflecting mirrors 63, 64 is referred to as a fourth distance D4.

In the light source device 11 according to the present embodiment, the reflecting mirrors 63, 64 are disposed so that the distance between the third light flux LS3 and the fourth light flux LS4 becomes smaller after the incidence to the reflecting mirrors 63, 64 than before the incidence thereto. Specifically, the fourth light flux LS4 reflected by the reflecting mirror 63 crosses the third light flux LS3 emitted from the third light source section 53, and is then reflected by the reflecting mirror 64. The reflecting mirror 64 is disposed at the position where the fourth distance D4 described above becomes smaller than the third distance D3 described above.

The third light flux LS3 and the fourth light flux LS4 enter the polarization combining element 12 in a state in which the distance between them is reduced in the Z-axis direction. Therefore, in the light source device 11 according to the present embodiment, the polarization combining element 12 can be reduced in size in the Z-axis direction.

In the present embodiment, the third light flux LS3 emitted from the third light source section 53 and the fourth light flux LS4 reflected by the reflecting mirror 64 enter the polarization combining element 12 as the P-polarized light. Therefore, the third light flux LS3 and the fourth light flux LS4 are transmitted through the polarization combining element 12, and are then emitted toward the Y-axis direction. The polarization combining element 12 combines the first light flux LS1, the second light flux LS2, the third light flux LS3, and the fourth light flux LS4 with each other to generate the first light B.

Figure 6:
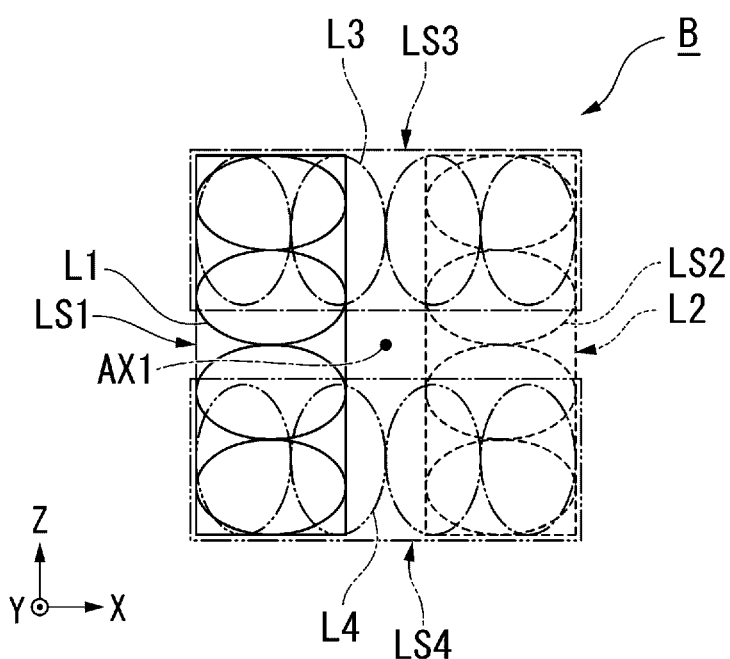
FIG. 6 is a diagram conceptually showing first light B combined by a polarization combining element.

FIG. 6 is a diagram conceptually showing the first light B combined by the polarization combining element 12. FIG. 6 is a diagram of the first light B viewed from the +Y side toward the −Y side.

As shown in FIG. 6, the four light beams L1 constituting the first light flux LS1 are disposed along the Z-axis direction (the first direction), and the four light beams L2 constituting the second light flux LS2 are disposed along the Z-axis direction. A shape of the cross-sectional surface perpendicular to the principal ray of each of the light beams L1 and each of the light beams L2 is an ellipse, and the short-axis direction of the ellipse coincides with the Z-axis direction in each of the light beams L1 and each of the light beams L2.

Further, the four light beams L3 constituting the third light flux LS3 are disposed along the X-axis direction (the second direction), and the four light beams L4 constituting the fourth light flux LS4 are disposed along the X-axis direction. A shape of the cross-sectional surface perpendicular to the principal ray of each of the light beams L3 and each of the light beams L4 is an ellipse, and the short-axis direction of the ellipse coincides with the X-axis direction in each of the light beams L3 and each of the light beams L4.

In the present embodiment, in the first light B, a positional relationship between a set of the first light flux LS1 and the second light flux LS2 and a set of the third light flux LS3 and the fourth light flux LS4 is different by 90 degrees in a circumferential direction with respect to the illumination light axis AX1 of the first light B. Thus, the first light B is enhanced in homogeneity of the intensity distribution since the light beams are disposed around the illumination light axis AX1 in a balanced manner.

Further, the first light B is reduced in beam diameter in two directions, namely the X-axis direction and the Z-axis direction, by setting the first light flux LS1 and the second light flux LS2 closer to the illumination axis AX1 in the X-axis direction, and at the same time setting the third light flux LS3 and the fourth light flux LS4 closer to the illumination axis AX1 in the Z-axis direction.

As described above, according to the light source device 11 related to the present embodiment, in the configuration provided with the four light source sections 51 through 54 each having the plurality of light emitting elements 41, 241, 341, or 441 disposed in sequence in one direction, it is possible to reduce the beam diameter of the first light B including the light fluxes LS1 through LS4 respectively emitted from the light source sections 51 through 54 without using an afocal optical system. When the beam width of the first light B including the light fluxes LS1 through LS4 respectively emitted from the four light source sections 51 through 54 is supposedly compressed using the afocal optical system, since an optical component such as a lens large enough to take in the light fluxes LS1 through LS4 becomes necessary, the device configuration grows in size to cause an increase in cost. According to the light source device 11 related to the present embodiment, it is possible to avoid such growth in size of the device configuration and such an increase in cost as when using the afocal optical system.

It should be noted that it is also possible to reverse the positions of the first light source unit 11A and the second light source unit 11B in the light source device 11 according to the present embodiment. When reversing the positions of the first light source unit 11A and the second light source unit 11B, it is sufficient for the first light source unit 11A to emit the P-polarized light with respect to the polarization combining element 12, and the second light source unit 11B to emit the S-polarized light with respect to the polarization combining element 12. Further, it is possible for the second light source unit 11B to be formed only of the third light source section 53.

Further, it is possible for the polarization combining element 12 to have an optical characteristic of transmitting the S-polarized light and reflecting the P-polarized light.

Advantages of the present embodiment will hereinafter be described.

The light source device 11 according to the present embodiment includes the first light source section 51 which has the plurality of light emitting elements 41 arranged in sequence in a row along the Z-axis direction, and which emits the first light flux LS1, the second light source section 52 which has the plurality of light emitting elements 241 arranged in sequence in a row along the Z-axis direction, and which emits the second light flux LS2, the third light source section 53 which has the plurality of light emitting elements 341 arranged in sequence in a row along the X-axis direction crossing the Z-axis direction, and which emits the third light flux LS3, the reflecting mirror 61 for reflecting the second light flux LS2 toward the X-axis direction crossing the emission direction of the second light flux LS2 and the Z-axis direction, the reflecting mirror 62 for reflecting the second light flux LS2 reflected by the reflecting mirror 61 toward the emission direction of the first light flux LS1, and the polarization combining element 12 which the first light flux LS1, the second light flux LS2 reflected by the reflecting mirror 62, and the third light flux LS3 enter, and which reflects either one of a set of the first light flux LS1 and the second light flux LS2 reflected by the reflecting mirror 62, and the third light flux LS3, and transmits the other of the set of the first light flux LS1 and the second light flux LS2 reflected by the reflecting mirror 62, and the third light flux LS3, wherein the first light flux LS1 and the second light flux LS2 reflected by the reflecting mirror 62 are the S-polarized light, and the third light flux LS3 is the P-polarized light different from the S-polarized light with respect to the polarization combining element 12, the reflecting mirror 61 and the reflecting mirror 62 are disposed so that in the distance between the first light flux LS1 and the second light flux LS2, the second distance D2 after the incidence to the reflecting mirror 61 and the reflecting mirror 62 becomes smaller than the first distance D1 before the incidence thereto, and the polarization combining element 12 combines the first light flux LS1, the second light flux LS2 reflected by the reflecting mirror 62, and the third light flux LS3 with each other.

According to the light source device 11 related to the present embodiment, by reflecting the second light flux LS2 with the reflecting mirrors 61, 62 so as to make the light path of the second light flux LS2 closer to the light path of the first light flux LS1, it is possible to decrease the distance between the first light flux LS1 and the second light flux LS2. Thus, it is possible to reduce the beam width of the light generated by combining the first light flux LS1, the second light flux LS2, and the third light flux LS3 with each other. Therefore, according to the light source device 11 related to the present embodiment, it is possible to generate the light reduced in beam width without using the afocal optical system. Therefore, it is possible for the light source device 11 according to the present embodiment to avoid such growth in size of the device configuration and such an increase in cost as when using the afocal optical system.

In the light source device 11 according to the present embodiment, it is possible to provide the reflecting mirror 13 which the first light flux LS1 and the second light flux LS2 reflected by the reflecting mirror 62 enter, and it is possible for the light reflected by the reflecting mirror 13 to enter the polarization combining element 12.

According to this configuration, it is possible to deflect the proceeding directions of the first light flux LS1 and the second light flux LS2 with the reflecting mirror 13 to make the first light flux LS1 and the second light flux LS2 enter the polarization combining element 12. Thus, the degree of design freedom of the installation places of the first light source section 51 and the second light source section 52 increases.

In the light source device 11 according to the present embodiment, the first light source section 51 has the substrate 42 for supporting the plurality of light emitting elements 41, the second light source section 52 has the substrate 242 for supporting the plurality of light emitting elements 241, the third light source section 53 has the substrate 342 for supporting the plurality of light emitting elements 341, and the substrates 42, 242, and 342 can each be disposed so as to be parallel to the predetermined plane.

According to this configuration, the respective substrates 42, 242, and 342 of the first light source section 51, the second light source section 52, and the third light source section 53 are disposed on the same plane. Thus, it becomes easy to cool each of the substrates 42, 242, and 342.

In the light source device 11 according to the present embodiment, there are included the fourth light source section 54 which has the plurality of light emitting elements 441 arranged in sequence in a row along the X-axis direction, and which emits the fourth light flux LS4, the reflecting mirror 63 for reflecting the fourth light flux LS4 toward the Y-axis direction crossing the emission direction of the fourth light flux LS4 and the X-axis direction, and the reflecting mirror 64 for reflecting the fourth light flux LS4 reflected by the reflecting mirror 63 toward the emission direction of the third light flux LS3, wherein the fourth light flux LS4 reflected by the reflecting mirror 64 is the P-polarized light with respect to the polarization combining element 12, the reflecting mirror 63 and the reflecting mirror 64 are disposed so that in the distance between the third light flux LS3 and the fourth light flux LS4, the fourth distance D4 after the incidence to the reflecting mirror 63 and the reflecting mirror 64 becomes smaller than the third distance D3 before the incidence thereto, and it is possible for the polarization combining element 12 to combine the first light flux LS1, the second light flux LS2 reflected by the reflecting mirror 62, the third light flux LS3, and the fourth light flux LS4 reflected by the reflecting mirror 64 with each other.

According to this configuration, by reflecting the fourth light flux LS4 with the reflecting mirrors 63, 64 so as to make the light path of the fourth light flux LS4 closer to the light path of the third light flux LS3, it is possible to decrease the distance between the third light flux LS3 and the fourth light flux LS4. Thus, it is possible to reduce the beam width of the first light B generated by combining the first through fourth light fluxs LS1, LS2, LS3, and LS4 with each other. Therefore, according to the light source device 11 related to the present embodiment, it is possible to generate the first light B reduced in beam width without using the afocal optical system.

The illumination device 2 according to the present embodiment is provided with the light source device 11 described above, the wavelength conversion element 15 for performing the wavelength conversion on the first light B from the light source device 11, and the dichroic mirror 19 for reflecting the light from the light source device 11 toward the wavelength conversion element 15, wherein the dichroic mirror 19 is disposed on the light path of the illumination light WL emitted from the wavelength conversion element 15.

According to the illumination device 2 related to the present embodiment, since it is possible to reduce the beam width of the first light B from the light source device 11, it is possible to reduce in size of the dichroic mirror 19 disposed on the light path of the illumination light WL. Thus, by reducing the light loss due to the dichroic mirror 19, the illumination device 2 high in light use efficiency is provided. Further, it is possible to provide the illumination device 2 which avoids the growth in size of the device configuration and the increase in cost caused by using the afocal optical system.

The projector according to the present disclosure is provided with the illumination device 2 described above, the light modulation devices 4R, 4G, and 4B for modulating the light from the illumination device 2 in accordance with the image information, and the projection optical device 6 for projecting the light modulated by the light modulation devices 4B, 4G, and 4R.

According to the projector 1 related to the present embodiment, since there is provided the illumination device 2 increased in light use efficiency of the illumination light WL, it is possible to provide the projector which is high in light efficiency, and displays a bright image. Further, since there is provided the illumination device 2 which avoids the growth in size of the device configuration and the increase in cost, it is possible to provide the projector small in size and low in cost.

Second Embodiment

Then, an illumination device according to a second embodiment will be described. The illumination device according to the present embodiment is different in the configuration of the light source device from the illumination device 2 according to the first embodiment. Hereinafter, a configuration of the light source device will mainly be described. It should be noted that members common to the first embodiment will be denoted by the same reference symbols, and the detailed description thereof will be omitted.

Figure 7:
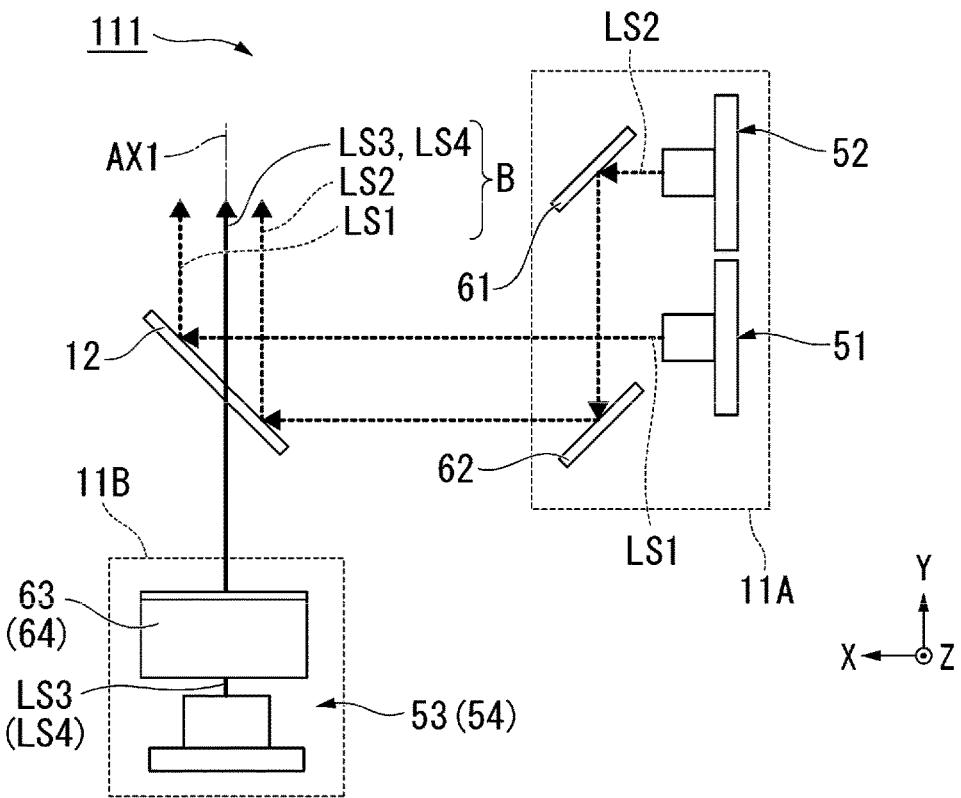
FIG. 7 is a plan view showing an overall configuration of a light source device according to a second embodiment.

FIG. 7 is a plan view of an overall configuration of the light source device 111 according to the present embodiment viewed from the +Z side toward the −Z side. FIG. 7 is a diagram corresponding to FIG. 3 in the first embodiment.

As shown in FIG. 7, the light source device 111 according to the present embodiment is provided with a first light source unit 11A, a second light source unit 11B, and a polarization combining element 12.

The light source device 111 according to the present embodiment makes the first light flux LS1 and the second light flux LS2 emitted from the first light source unit 11A directly enter the polarization combining element 12. In other words, the light source device 111 according to the present embodiment has a configuration in which the reflecting mirror 13 is omitted from the light source device 11 according to the first embodiment, and at the same time, the first light source unit 11A is disposed in a state of being rotated 90 degrees counterclockwise with respect to an axis parallel to the Z axis.

Also in the light source device 111 according to the present embodiment, it is possible to generate the first light B reduced in beam width without using the afocal optical system. Further, by omitting the reflecting mirror 13, it is possible to reduce the number of components compared to the light source device 11 according to the first embodiment.

It should be noted that it is also possible to reverse the positions of the first light source unit 11A and the second light source unit 11B in the light source device 111 according to the present embodiment. When reversing the positions of the first light source unit 11A and the second light source unit 11B, it is sufficient for the first light source unit 11A to emit the P-polarized light with respect to the polarization combining element 12, and the second light source unit 11B to emit the S-polarized light with respect to the polarization combining element 12. Further, it is possible for the second light source unit 11B to be formed only of the third light source section 53.

It should be noted that in the light source device 111 according to the present embodiment, it is possible for the first light source unit 11A to have a configuration of being disposed at a position line symmetric about an axis parallel to the X axis obtained by flipping the first light source unit 11A toward the −Y side with reference to that axis. In this configuration, the second light source section 52 is disposed at the −Y side of the first light source section 51. Similarly, the reflecting mirror 61 is disposed at the −Y side of the first light source section 51. In contrast, the reflecting mirror 62 is disposed at the +Y side of the first light source section 51.

Third Embodiment

Then, an illumination device according to a third embodiment will be described. The illumination device according to the present embodiment is different in the configuration of the light source device from the illumination device 2 according to the first embodiment. Hereinafter, a configuration of the light source device will mainly be described. It should be noted that members common to the first embodiment will be denoted by the same reference symbols, and the detailed description thereof will be omitted.

Figure 8:
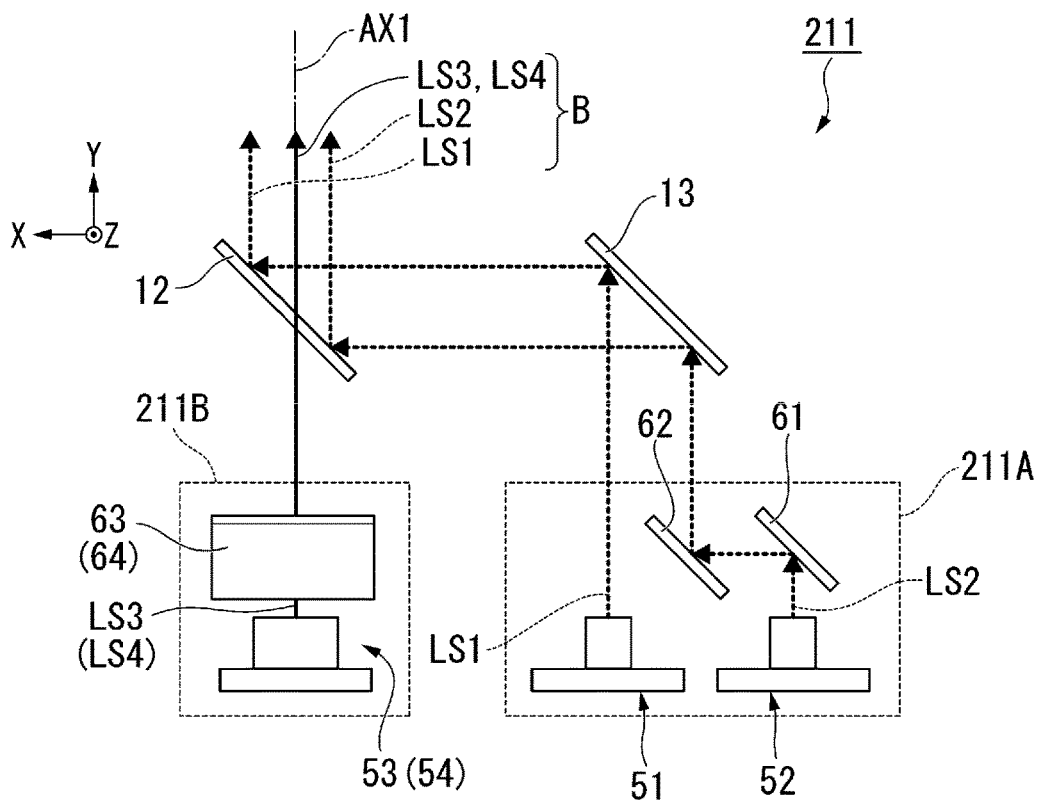
FIG. 8 is a plan view showing an overall configuration of a light source device according to a third embodiment.

FIG. 8 is a plan view of an overall configuration of the light source device 211 according to the present embodiment viewed from the +Z side toward the −Z side. FIG. 8 is a diagram corresponding to FIG. 3 in the first embodiment.

As shown in FIG. 8, the light source device 211 according to the present embodiment is provided with a first light source unit 211A, a second light source unit 211B, the polarization combining element 12, and the reflecting mirror 13.

The first light source unit 211A has the first light source section 51, the second light source section 52, the reflecting mirror 61, and the reflecting mirror 62. In the first light source unit 211A in the present embodiment, the reflecting mirror 62 is disposed at the −X side of the first light source section 51. In other words, in the first light source unit 211A in the present embodiment, the reflecting mirror 62 is disposed closer to the reflecting mirror 61 compared to the first light source unit 11A according to the first embodiment. Since the reflecting mirror 62 is disposed between the first light source section 51 and the second light source section 52 in the X-axis direction, the dimension of the first light source unit 211A in the X-axis direction is made smaller.

Therefore, also in the light source device 211 according to the present embodiment, the reflecting mirrors 61, 62 are disposed so that the distance between the first light flux LS1 and the second light flux LS2 becomes smaller after the incidence to the reflecting mirrors 61, 62 than before the incidence thereto.

Specifically, the reflecting mirror 62 is disposed at a position where the second light flux LS2 reflected by the reflecting mirror 61 is reflected by the reflecting mirror 62 before crossing the first light flux LS1 emitted from the first light source section 51.

The second light source unit 211B has the third light source section 53, the fourth light source section 54, the reflecting mirror 63, and the reflecting mirror 64. A positional relationship in each of the members between the second light source unit 211B and the first light source unit 211A is the same as the positional relationship in each of the members between the second light source unit 11B and the first light source unit 11A in the light source device 11 according to the first embodiment. Specifically, although not shown in the drawings, in the second light source unit 211B in the present embodiment, the reflecting mirror 64 is located at the +Z side of the third light source section 53, and the reflecting mirrors 63, 64 are disposed so that the distance between the third light flux LS3 and the fourth light flux LS4 becomes smaller after the incidence to the reflecting mirrors 63, 64 than before the incidence thereto. According to this configuration, it is possible to decrease the dimension of the second light source unit 211B in the Z-axis direction.

Also in the light source device 211 according to the present embodiment having the configuration described above, it is possible to generate the first light B reduced in beam width without using the afocal optical system. Further, since the dimension in the X-axis direction of the first light source unit 211A and the dimension in the X-axis direction of the second light source unit 211B are made smaller, it is possible to further reduce the size of the light source device 211.

It should be noted that it is also possible to reverse the positions of the first light source unit 211A and the second light source unit 211B in the light source device 211 according to the present embodiment. When reversing the positions of the first light source unit 211A and the second light source unit 211B, it is sufficient for the first light source unit 211A to emit the P-polarized light with respect to the polarization combining element 12, and the second light source unit 211B to emit the S-polarized light with respect to the polarization combining element 12. Further, it is possible for the second light source unit 211B to be formed only of the third light source section 53.

Fourth Embodiment

Then, a light source device according to a fourth embodiment will be described. Hereinafter, a configuration of the light source device will mainly be described. It should be noted that members common to the third embodiment will be denoted by the same reference symbols, and the detailed description thereof will be omitted.

Figure 9:
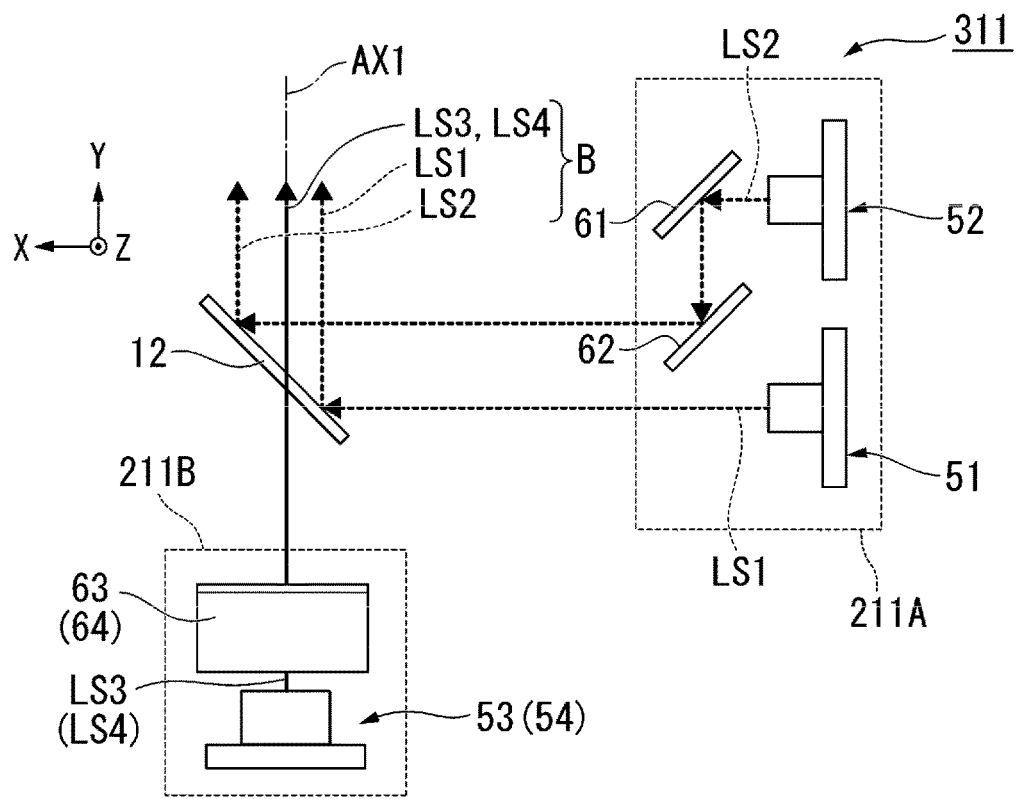
FIG. 9 is a plan view showing an overall configuration of a light source device according to a fourth embodiment.

FIG. 9 is a plan view of an overall configuration of the light source device 311 according to the present embodiment viewed from the +Z side toward the −Z side. As shown in FIG. 9, the light source device 311 according to the present embodiment is provided with the first light source unit 211A, the second light source unit 211B, and the polarization combining element 12.

The light source device 311 according to the present embodiment is arranged to make the first light flux LS1 and the second light flux LS2 emitted from the first light source unit 211A directly enter the polarization combining element 12. In other words, the light source device 311 according to the present embodiment has a configuration in which the reflecting mirror 13 is omitted from the light source device 211 according to the third embodiment, and at the same time, the first light source unit 211A is disposed in a state of being rotated 90 degrees counterclockwise with respect to an axis parallel to the Z axis.

Also in the light source device 311 according to the present embodiment, it is possible to generate the first light B reduced in beam width without using the afocal optical system. Further, by omitting the reflecting mirror 13, it is possible to reduce the number of components compared to the light source device 211 according to the third embodiment.

It should be noted that it is also possible to reverse the positions of the first light source unit 211A and the second light source unit 211B in the light source device 311 according to the present embodiment. When reversing the positions of the first light source unit 211A and the second light source unit 211B, it is sufficient for the first light source unit 211A to emit the P-polarized light with respect to the polarization combining element 12, and the second light source unit 211B to emit the S-polarized light with respect to the polarization combining element 12. Further, it is possible for the second light source unit 211B to be formed only of the third light source section 53.

It should be noted that in the light source device 311 according to the present embodiment, it is possible for the first light source unit 211A to have a configuration of being disposed at a position line symmetric about an axis parallel to the X axis obtained by flipping the first light source unit 211A toward the −Y side with reference to that axis. In this configuration, the second light source section 52 is disposed at the −Y side of the first light source section 51. Similarly, the reflecting mirror 61 is disposed at the −Y side of the first light source section 51. Further similarly, the reflecting mirror 62 is disposed at the −Y side of the first light source section 51.

Fifth Embodiment

Then, an illumination device according to a fifth embodiment will be described. The illumination device according to the present embodiment is different in the configuration of the light source device from the illumination device 2 according to the first embodiment. Hereinafter, a configuration of the light source device will mainly be described. It should be noted that members common to the first embodiment will be denoted by the same reference symbols, and the detailed description thereof will be omitted.

Figure 10:
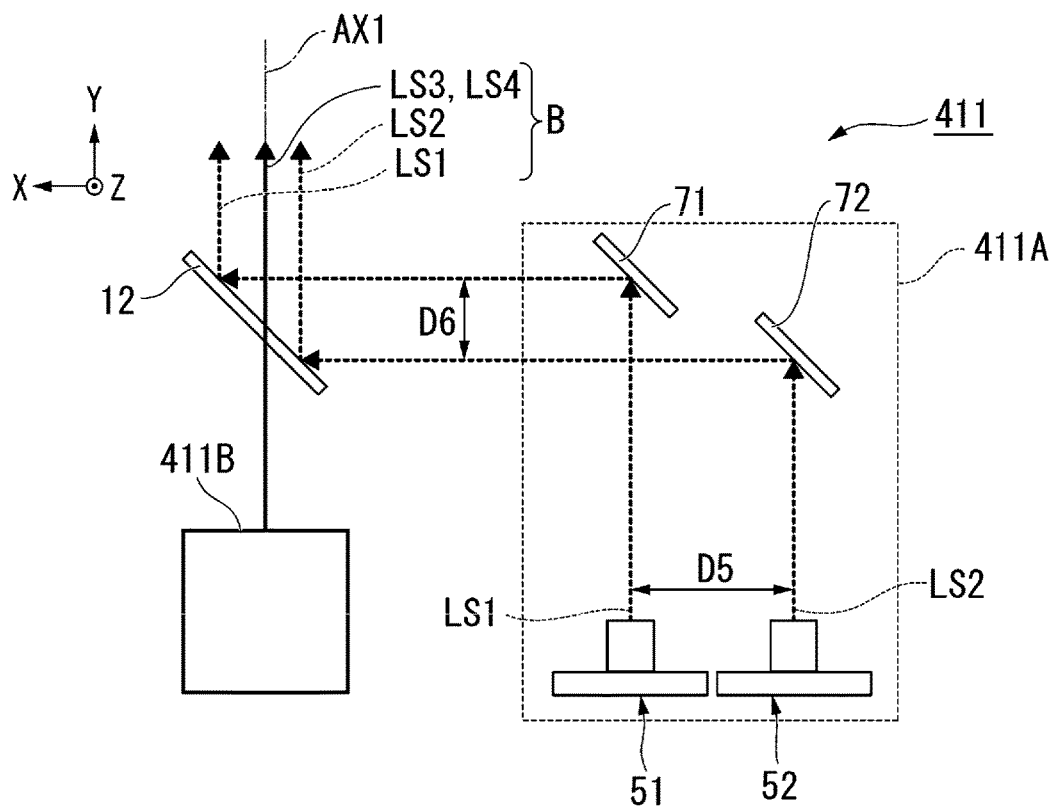
FIG. 10 is a plan view showing an overall configuration of a light source device according to a fifth embodiment.

FIG. 10 is a plan view of an overall configuration of the light source device 411 according to the present embodiment viewed from the +Z side toward the −Z side. FIG. 10 is a diagram corresponding to FIG. 3 in the first embodiment.

As shown in FIG. 10, the light source device 411 according to the present embodiment is provided with a first light source unit 411A, a second light source unit 411B, and the polarization combining element 12.

The first light source unit 411A has the first light source section 51, the second light source section 52, a reflecting mirror (the first reflecting member) 71, and a reflecting mirror (the second reflecting member) 72.

The reflecting mirror 71 reflects the first light flux LS1 to be emitted from the first light source section 51 toward the X-axis direction crossing the Y-axis direction as the emission direction of the first light flux LS1 and the Z-axis direction. Specifically, the first light flux LS1 is reflected by the reflecting mirror 71 toward the polarization combining element 12.

The reflecting mirror 72 reflects the second light flux LS2 to be emitted from the second light source section 52 toward the X-axis direction crossing the Y-axis direction as the emission direction of the second light flux LS2 and the Z-axis direction. Specifically, the second light flux LS2 is reflected by the reflecting mirror 72 toward the polarization combining element 12. In the present embodiment, the reflecting mirror 72 is disposed at the −X side and the −Y side of the reflecting mirror 71. It should be noted that the reflecting mirror 71 and the reflecting mirror 72 are each formed of, for example, a plate-like member provided with a film made of a metal film or a dielectric multilayer film.

Here, a distance between the first light flux LS1 and the second light flux LS2 before entering the reflecting mirrors 71, 72 is referred to as a fifth distance D5, and a distance between the first light flux LS1 and the second light flux LS2 after entering the reflecting mirrors 71, 72 is referred to as a sixth distance D6.

In the light source device 411 according to the present embodiment, the reflecting mirrors 71, 72 are disposed so that the sixth distance D6 after the incidence to the reflecting mirrors 71, 72 is smaller than the fifth distance D5 before the incidence thereto regarding the distance between the first light flux LS1 and the second light flux LS2. Specifically, the reflecting mirror 72 is disposed at a position where the second light flux LS2 reflected by the reflecting mirror 72 is made to cross the first light flux LS1 which has been emitted from the first light source section 51 but has not yet entered the reflecting mirror 71. Therefore, the first light flux LS1 and the second light flux LS2 enter the polarization combining element 12 in a state in which the distance between them is reduced in the Y-axis direction.

The second light source unit 411B has substantially the same configuration as that of the second light source unit 11B or the second light source unit 211B in the embodiments described above. In other words, the second light source unit 411B makes the third light flux LS3 and the fourth light flux LS4 enter the polarization combining element 12 in a state in which the distance in the Z-axis direction between the third light flux LS3 and the fourth light flux LS4 is reduced.

Advantages of the light source device 411 according to the present embodiment will hereinafter be described.

The light source device 411 according to the present embodiment includes the first light source section 51 which has the plurality of light emitting elements 41 arranged in sequence in a row along the Z-axis direction, and which emits the first light flux LS1, the second light source section 52 which has the plurality of light emitting elements 241 arranged in sequence in a row along the Z-axis direction, and which emits the second light flux LS2, the third light source section 53 which has the plurality of light emitting elements 341 arranged in sequence in a row along the X-axis direction crossing the Z-axis direction, and which emits the third light flux LS3, the reflecting mirror 71 for reflecting the first light flux LS1 toward the X-axis direction crossing the emission direction of the first light flux LS1 and the Z-axis direction, the reflecting mirror 72 for reflecting the second light flux LS2 toward the X-axis direction crossing the emission direction of the second light flux LS2 and the Z-axis direction, and the polarization combining element 12 which the first light flux LS1 reflected by the reflecting mirror 71, the second light flux LS2 reflected by the reflecting mirror 72, and the third light flux LS3 enter, and which reflects either one of a set of the first light flux LS1 reflected by the reflecting mirror 71 and the second light flux LS2 reflected by the reflecting mirror 72, and the third light flux LS3, and transmits the other of the set of the first light flux LS1 reflected by the reflecting mirror 71 and the second light flux LS2 reflected by the reflecting mirror 72, and the third light flux LS3, wherein the first light flux LS1 reflected by the reflecting mirror 71 and the second light flux LS2 reflected by the reflecting mirror 72 are the S-polarized light, and the third light flux LS3 is the P-polarized light with respect to the polarization combining element 12, the reflecting mirror 71 and the reflecting mirror 72 are disposed so that in the distance between the first light flux LS1 and the second light flux LS2, the sixth distance D6 after the incidence to the reflecting mirror 71 and the reflecting mirror 72 becomes smaller than the fifth distance D5 before the incidence thereto, and the polarization combining element 12 combines the first light flux LS1 reflected by the reflecting mirror 71, the second light flux LS2 reflected by the reflecting mirror 72, and the third light flux LS3 with each other.

According to the light source device 411 related to the present embodiment, by reflecting first light flux LS1 and the second light flux LS2 with the reflecting mirrors 71, 72 so as to make the light path of the first light flux LS1 and the light path of the second light flux LS2 closer to each other, it is possible to decrease the distance between the first light flux LS1 and the second light flux LS2. Further, also in the second light source unit 411B, it is possible to decrease the distance between the third light flux LS3 and the fourth light flux LS4.

Therefore, according to the light source device 411 related to the present embodiment, it is possible to generate the first light B reduced in beam width without using the afocal optical system.

It should be noted that it is also possible to reverse the positions of the first light source unit 411A and the second light source unit 411B in the light source device 411 according to the present embodiment. When reversing the positions of the first light source unit 411A and the second light source unit 411B, it is sufficient for the first light source unit 411A to emit the P-polarized light with respect to the polarization combining element 12, and the second light source unit 411B to emit the S-polarized light with respect to the polarization combining element 12.

Sixth Embodiment

Then, a light source device according to a sixth embodiment will be described. It should be noted that members common to the fifth embodiment will be denoted by the same reference symbols, and the detailed description thereof will be omitted.

Figure 11:
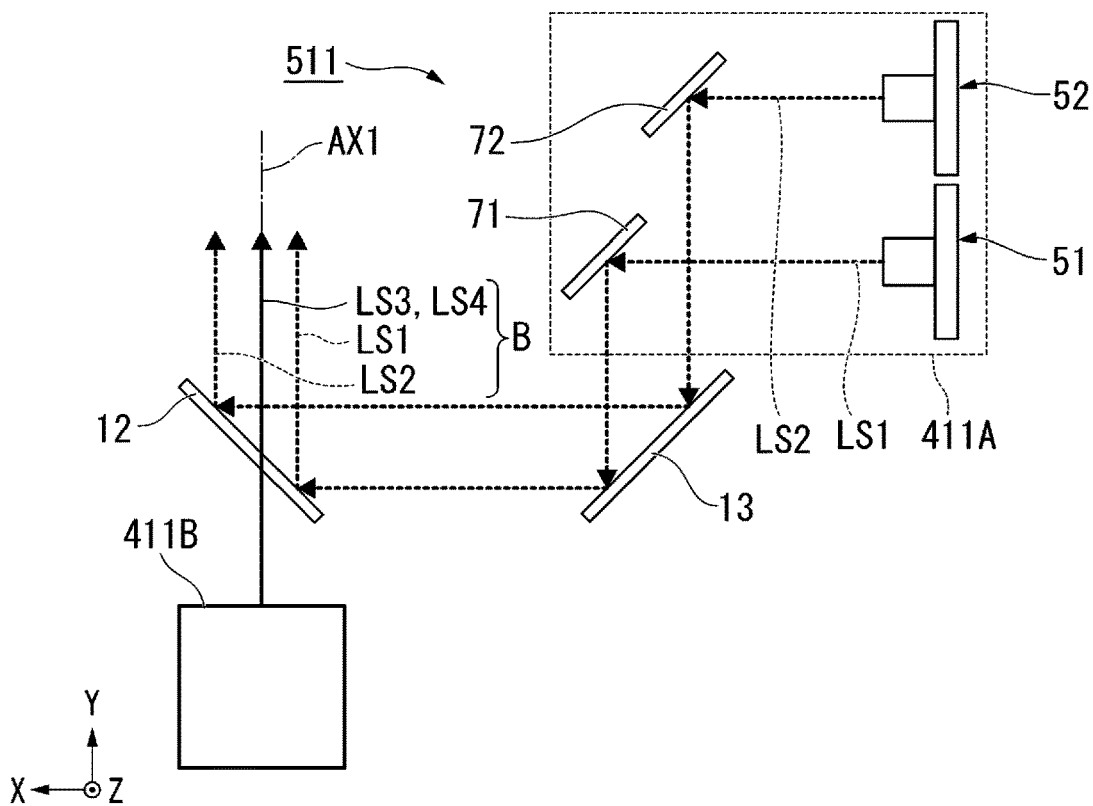
FIG. 11 is a plan view showing an overall configuration of a light source device according to a sixth embodiment.

FIG. 11 is a plan view of an overall configuration of the light source device 511 according to the present embodiment viewed from the +Z side toward the −Z side. As shown in FIG. 11, the light source device 511 according to the present embodiment is provided with the first light source unit 411A, the second light source unit 411B, the polarization combining element 12, and the reflecting mirror (the fifth reflecting member) 13.

The light source device 511 according to the present embodiment is arranged to reflect the first light flux LS1 and the second light flux LS2 emitted from the first light source unit 411A with the reflecting mirror 13 to make the light fluxes enter the polarization combining element 12. In other words, the light source device 511 according to the present embodiment has a configuration in which the reflecting mirror 13 is added to the light source device 411 according to the fifth embodiment, and at the same time, the first light source unit 411A is disposed in a state of being rotated 90 degrees counterclockwise with respect to an axis parallel to the Z axis.

Also in the light source device 511 according to the present embodiment, it is possible to generate the first light B reduced in beam width without using the afocal optical system.

Further, in the light source device 511 according to the present embodiment, there is provided the reflecting mirror 13 which the first light flux LS1 reflected by the reflecting mirror 71 and the second light flux LS2 reflected by the reflecting mirror 72 enter, and the light reflected by the reflecting mirror 13 enters the polarization combining element 12. According to the light source device 511 related to the present embodiment, it is possible to deflect the proceeding directions of the first light flux LS1 and the second light flux LS2 with the reflecting mirror 13 to make the first light flux LS1 and the second light flux LS2 enter the polarization combining element 12. Thus, the degree of design freedom of the installation places of the first light source section 51 and the second light source section 52 increases.

It should be noted that it is also possible to reverse the positions of the first light source unit 411A and the second light source unit 411B in the light source device 511 according to the present embodiment. In this case, it is sufficient for the first light source unit 411A to emit the P-polarized light with respect to the polarization combining element 12, and the second light source unit 411B to emit the S-polarized light with respect to the polarization combining element 12.

It should be noted that in the light source device 511 according to the present embodiment, it is possible for the first light source unit 411A to have a configuration of being disposed at a position line symmetric about an axis parallel to the X axis obtained by flipping the first light source unit 411A toward the −Y side with reference to that axis. In this configuration, the second light source section 52 is disposed at the −Y side of the first light source section 51. Similarly, the reflecting mirror 72 is disposed at the −Y side of the first light source section 51.

Seventh Embodiment

Then, a light source device according to a seventh embodiment will be described. It should be noted that members common to the first embodiment will be denoted by the same reference symbols, and the detailed description thereof will be omitted.

Figure 12:
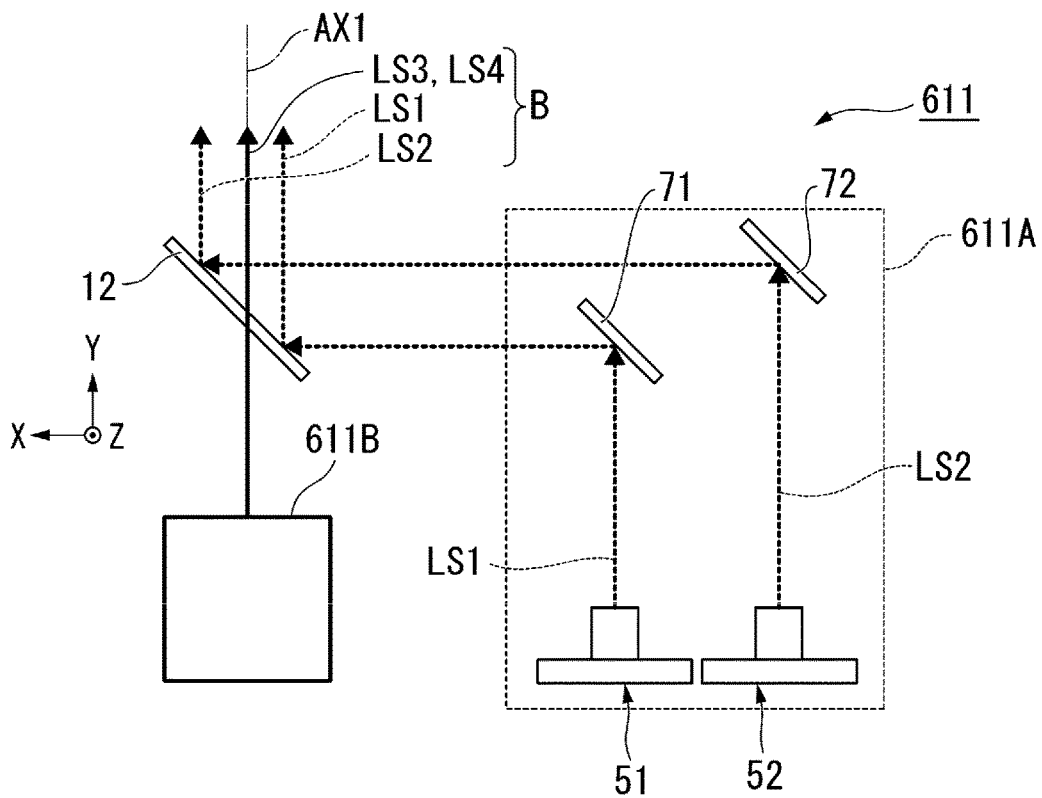
FIG. 12 is a plan view showing an overall configuration of a light source device according to a seventh embodiment.

FIG. 12 is a plan view of an overall configuration of the light source device 611 according to the present embodiment viewed from the +Z side toward the −Z side. FIG. 12 is a diagram corresponding to FIG. 3 in the first embodiment.

As shown in FIG. 12, the light source device 611 according to the present embodiment is provided with a first light source unit 611A, a second light source unit 611B, and the polarization combining element 12.

The first light source unit 611A has the first light source section 51, the second light source section 52, the reflecting mirror 71, and the reflecting mirror 72. In the first light source unit 611A in the present embodiment, the reflecting mirror 71 is disposed at the −Y side of the reflecting mirror 72. In other words, in the first light source unit 611A in the present embodiment, the distance in the Y-axis direction between the reflecting mirror 71 and the first light source section 51 is shorter than the distance in the Y-axis direction between the reflecting mirror 72 and the second light source section 52. Specifically, the reflecting mirror 71 is disposed at a position where the reflecting mirror 71 reflects the first light flux LS1 at the front side (−Y side) of the light path of the second light flux LS2 reflected by the reflecting mirror 72 so that the second light flux LS2 reflected by the reflecting mirror 72 and the first light flux LS1 emitted from the first light source section 51 do not cross each other.

Also in the light source device 611 according to the present embodiment, the reflecting mirrors 71, 72 are disposed so that the distance between the first light flux LS1 and the second light flux LS2 becomes smaller after the incidence to the reflecting mirrors 71, 72 than before the incidence thereto.

The second light source unit 611B has substantially the same configuration as that of the second light source unit 411B in the embodiments described above. In other words, the second light source unit 611B has substantially the same configuration as that of the second light source unit 11B or the second light source unit 211B in the embodiments described above. Therefore, the second light source unit 611B makes the third light flux LS3 and the fourth light flux LS4 enter the polarization combining element 12 in a state in which the distance in the Z-axis direction between the third light flux LS3 and the fourth light flux LS4 is reduced.

Also in the light source device 611 according to the present embodiment, it is possible to generate the first light B reduced in beam width without using the afocal optical system.

It should be noted that it is also possible to reverse the positions of the first light source unit 611A and the second light source unit 611B in the light source device 611 according to the present embodiment. In this case, it is sufficient for the first light source unit 611A to emit the P-polarized light with respect to the polarization combining element 12, and the second light source unit 611B to emit the S-polarized light with respect to the polarization combining element 12.

Eighth Embodiment

Then, a light source device according to an eighth embodiment will be described. It should be noted that members common to the seventh embodiment will be denoted by the same reference symbols, and the detailed description thereof will be omitted.

Figure 13:
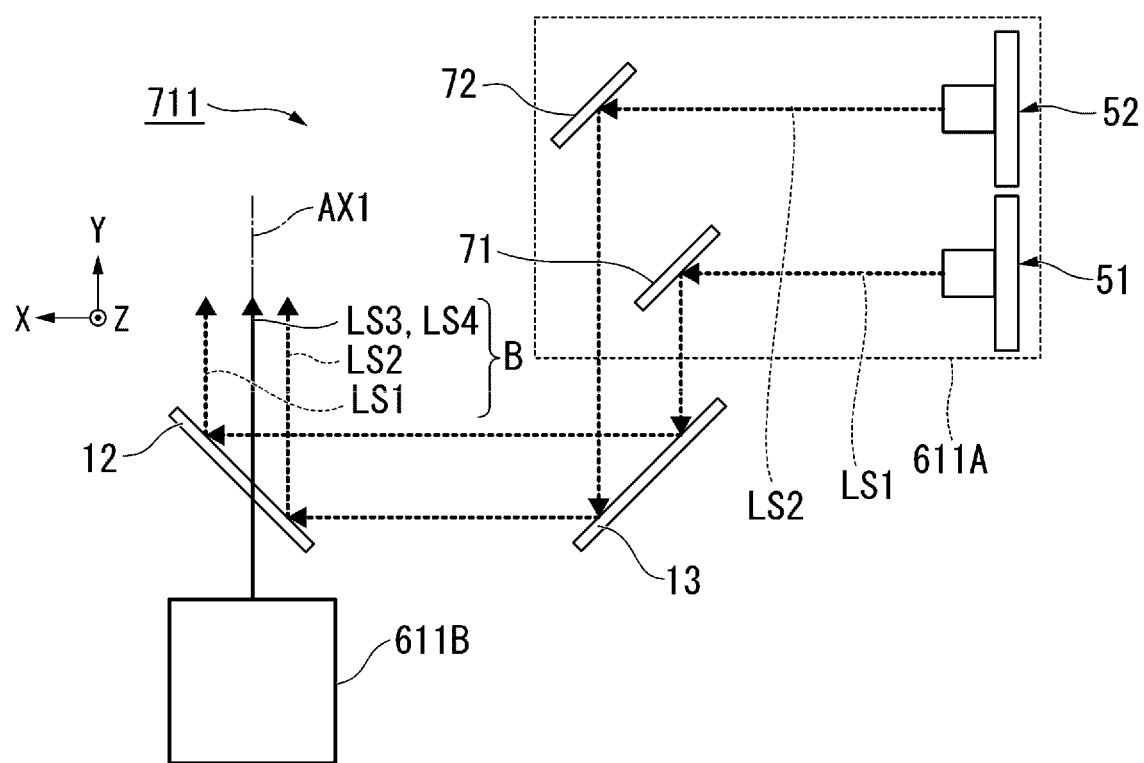
FIG. 13 is a plan view showing an overall configuration of a light source device according to an eighth embodiment.

FIG. 13 is a plan view of an overall configuration of the light source device 711 according to the present embodiment viewed from the +Z side toward the −Z side. As shown in FIG. 13, the light source device 711 according to the present embodiment is provided with the first light source unit 611A, the second light source unit 611B, the polarization combining element 12, and the reflecting mirror 13.

The light source device 711 according to the present embodiment is arranged to reflect the first light flux LS1 and the second light flux LS2 emitted from the first light source unit 611A with the reflecting mirror 13 to make the light fluxes enter the polarization combining element 12. In other words, the light source device 711 according to the present embodiment has a configuration in which the reflecting mirror 13 is added to the light source device 611 according to the seventh embodiment, and at the same time, the first light source unit 611A is disposed in a state of being rotated 90 degrees counterclockwise with respect to an axis parallel to the Z axis.

Also in the light source device 711 according to the present embodiment, it is possible to generate the first light B reduced in beam width without using the afocal optical system.

It should be noted that it is also possible to reverse the positions of the first light source unit 611A and the second light source unit 611B in the light source device 711 according to the present embodiment. In this case, it is sufficient for the first light source unit 611A to emit the P-polarized light with respect to the polarization combining element 12, and the second light source unit 611B to emit the S-polarized light with respect to the polarization combining element 12.

It should be noted that in the light source device 711 according to the present embodiment, it is possible for the first light source unit 611A to have a configuration of being disposed at a position line symmetric about an axis parallel to the X axis obtained by flipping the first light source unit 611A toward the −Y side with reference to that axis. In this configuration, the second light source section 52 is disposed at the −Y side of the first light source section 51. Similarly, the reflecting mirror 72 is disposed at the −Y side of the first light source section 51.

It should be noted that the scope of the present disclosure is not limited to the embodiments described above, but a variety of modifications can be provided thereto within the scope or the spirit of the present disclosure.

For example, in the light source devices 11, 111 according to the embodiment and the modified example described above, it is possible to replace the first light source unit 11A with either one of the first light source units 211A, 411A, and 611A. Further, in the light source devices 11, 111, and 112 described above, it is possible to replace the second light source unit 11B with the second light source unit 211B.

Further, in the light source devices 211, 311 according to the embodiment and the modified example described above, it is possible to replace the first light source unit 211A with either one of the first light source units 11A, 411A, and 611A. Further, in the light source devices 211, 311 described above, it is possible to replace the second light source unit 211B with the second light source unit 11B.

Further, in the light source devices 411, 511 according to the embodiment and the modified example described above, it is possible to replace the first light source unit 411A with either one of the first light source units 11A, 211A, and 611A. Further, in the light source devices 411, 511 described above, it is possible to replace the second light source unit 411B with a unit having substantially the same configuration as that of the first light source unit 411A, 611A.

Further, in the light source devices 611, 711 according to the embodiment and the modified example described above, it is possible to replace the first light source unit 611A with either one of the first light source units 11A, 211A, and 411A. Further, in the light source devices 611, 711 described above, it is possible to replace the second light source unit 611B with a unit having substantially the same configuration as that of the first light source unit 411A, 611A.

Further, in the light source devices 11, 111 according to the embodiment and the modified example described above, it is possible to replace the second light source unit 11B with either one of the first light source units 211A, 411A, and 611A.

Further, in the light source devices 211, 311 described above, it is possible to replace the second light source unit 211B with either one of the first light source units 211A, 411A, and 611A.

Further, in the light source devices 411, 511 described above, it is possible to replace the second light source unit 411B with either one of the first light source units 211A, 411A, and 611A.

Further, in the light source devices 611, 711 described above, it is possible to replace the second light source unit 611B with either one of the first light source units 211A, 411A, and 611A.

Besides the above, the specific descriptions of the shape, the number, the arrangement, the material, and so on of the constituents of the light source device and the projector are not limited to those in the embodiments described above, but can arbitrarily be modified. Although in the embodiments described above, there is described the example of installing the light source device according to the present disclosure in the projector using the liquid crystal light valves, the example is not a limitation. The light source device according to the present disclosure can also be applied to a projector using digital micromirror devices as the light modulation devices. Further, the projector is not required to have a plurality of light modulation devices, and can be provided with just one light modulation device.

Although in the embodiments described above, there is described the example of applying the light source device according to the present disclosure to the projector, the example is not a limitation. The light source device according to the present disclosure can also be applied to lighting equipment, a headlight of a vehicle, and so on.

It is also possible for a light source device according to an aspect of the present disclosure to have the following configuration.

The light source device according to an aspect of the present disclosure includes a first light source section which has a plurality of first light emitting elements arranged in sequence in a row along a first direction, and which is configured to emit a first light flux, a second light source section which has a plurality of second light emitting elements arranged in sequence in a row along the first direction, and which is configured to emit a second light flux, a third light source section which has a plurality of third light emitting elements arranged in sequence in a row along a second direction crossing the first direction, and which is configured to emit a third light flux, a first reflecting member configured to reflect the second light flux toward a direction crossing an emission direction of the second light flux and the first direction, a second reflecting member configured to reflect the second light flux reflected by the first reflecting member toward an emission direction of the first light flux, and a polarization combining element which the first light flux, the second light flux reflected by the second reflecting member, and the third light flux enter, which is configured to reflect one of the first light flux and the second light flux reflected by the second reflecting member, and the third light flux, and which is configured to transmit another of the first light flux and the second light flux reflected by the second reflecting member, and the third light flux, wherein with respect to the polarization combining element, the first light flux and the second light flux reflected by the second reflecting member are light polarized in a first polarization direction, and the third light flux is light polarized in a second polarization direction different from the first polarization direction, the first reflecting member and the second reflecting member are disposed so that a distance between the first light flux and the second light flux becomes smaller after incidence to the first reflecting member and the second reflecting member than before the incidence, and the polarization combining element combines the first light flux, the second light flux reflected by the second reflecting member, and the third light flux with each other.

In the light source device according to the aspect of the present disclosure, there is further included a fifth reflecting member which the first light flux and the second light flux reflected by the second reflecting member enter, wherein light reflected by the fifth reflecting member enters the polarization combining element.

A light source device according to another aspect of the present disclosure includes a first light source section which has a plurality of first light emitting elements arranged in sequence in a row along a first direction, and which is configured to emit a first light flux, a second light source section which has a plurality of second light emitting elements arranged in sequence in a row along the first direction, and which is configured to emit a second light flux, a third light source section which has a plurality of third light emitting elements arranged in sequence in a row along a second direction crossing the first direction, and which is configured to emit a third light flux, a first reflecting member configured to reflect the first light flux toward a direction crossing an emission direction of the first light flux and the first direction, a second reflecting member configured to reflect the second light flux toward a direction crossing an emission direction of the second light flux and the first direction, and a polarization combining element which the first light flux reflected by the first reflecting member, the second light flux reflected by the second reflecting member, and the third light flux enter, which is configured to reflect one of the first light flux reflected by the first reflecting member and the second light flux reflected by the second reflecting member, and the third light flux, and which is configured to transmit another of the first light flux reflected by the first reflecting member and the second light flux reflected by the second reflecting member, and the third light flux, wherein with respect to the polarization combining element, the first light flux reflected by the first reflecting member and the second light flux reflected by the second reflecting member are light polarized in a first polarization direction, and the third light flux is light polarized in a second polarization direction different from the first polarization direction, the first reflecting member and the second reflecting member are disposed so that a distance between the first light flux and the second light flux becomes smaller after incidence to the first reflecting member and the second reflecting member than before the incidence, and the polarization combining element combines the first light flux reflected by the first reflecting member, the second light flux reflected by the second reflecting member, and the third light flux with each other.

In the light source device according to the aspect of the present disclosure, there is further included a fifth reflecting member which the first light flux reflected by the first reflecting member and the second light flux reflected by the second reflecting member enter, wherein light reflected by the fifth reflecting member enters the polarization combining element.

In the light source device according to the aspect of the present disclosure, the first light source section has a first substrate configured to support the plurality of first light emitting elements, the second light source section has a second substrate configured to support the plurality of second light emitting elements, the third light source section has a third substrate configured to support the plurality of third light emitting elements, and the first substrate, the second substrate, and the third substrate are each disposed in parallel to a predetermined plane.

In the light source device according to the aspect of the present disclosure, there are further included a fourth light source section which has a plurality of fourth light emitting elements arranged in sequence in a row along the second direction, and which is configured to emit a fourth light flux, a third reflecting member configured to reflect the fourth light flux toward a direction crossing an emission direction of the fourth light flux and the second direction, and a fourth reflecting member configured to reflect the fourth light flux reflected by the third reflecting member toward an emission direction of the third light flux, wherein the fourth light flux reflected by the fourth reflecting member is light polarized in the second polarization direction with respect to the polarization combining element, the third reflecting member and the fourth reflecting member are disposed so that a distance between the third light flux and the fourth light flux becomes smaller after incidence to the third reflecting member and the fourth reflecting member than before the incidence, and the polarization combining element combines the first light flux, the second light flux reflected by the second reflecting member, the third light flux, and the fourth light flux reflected by the fourth reflecting member with each other.

It is also possible for an illumination device according to another aspect of the present disclosure to have the following configuration.

The illumination device according to another aspect of the present disclosure includes the light source device according to the aspect described above, a wavelength conversion element configured to perform wavelength conversion on the light from the light source device, and a reflecting member configured to reflect the light from the light source device toward the wavelength conversion element, wherein the reflecting member is disposed on a light path of light emitted from the wavelength conversion element.

It is also possible for a projector according to another aspect of the present disclosure to have the following configuration.

The projector according to another aspect of the present disclosure includes the illumination device according to the aspect of the present disclosure, a light modulation device configured to modulate the light from the illumination device in accordance with image information, and a projection optical device configured to project the light modulated by the light modulation device.

What is claimed is:

1. A light source device comprising:
   a first light source section which has a plurality of first light emitting elements arranged in a row along a first direction, and which is configured to emit a first light flux;
   a second light source section which has a plurality of second light emitting elements arranged in a row along the first direction, and which is configured to emit a second light flux;
   a third light source section which has a plurality of third light emitting elements arranged in a row along a second direction crossing the first direction, and which is configured to emit a third light flux;
   a first reflecting member configured to reflect the second light flux toward a direction crossing an emission direction of the second light flux and the first direction;
   a second reflecting member configured to reflect the second light flux reflected by the first reflecting member toward an emission direction of the first light flux;
   a fifth reflecting member which the first light flux and the second light flux reflected by the second reflecting member enter; and
   a polarization combining element which the first and second second light fluxes reflected by the fifth reflecting member, and the third light flux enter, which is configured to reflect one of the first and second light fluxes reflected by the fifth reflecting member, and the third light flux, and which is configured to transmit another of the first and second light fluxes reflected by the fifth reflecting member, and the third light flux, wherein
   with respect to the polarization combining element, the first and second light fluxes reflected by the fifth reflecting member are light polarized in a first polarization direction, and the third light flux is light polarized in a second polarization direction different from the first polarization direction,
   the first reflecting member and the second reflecting member are disposed so that a distance between the first light flux and the second light flux becomes smaller after incidence to the first reflecting member and the second reflecting member than before the incidence, and
   the polarization combining element combines the first and second light fluxes reflected by the fifth reflecting member, and the third light flux with each other.

2. The light source device according to claim 1, wherein
   the first light source section has a first substrate configured to support the plurality of first light emitting elements,
   the second light source section has a second substrate configured to support the plurality of second light emitting elements,
   the third light source section has a third substrate configured to support the plurality of third light emitting elements, and
   the first substrate, the second substrate, and the third substrate are each disposed in parallel to a predetermined plane.

3. The light source device according to claim 1, further comprising:
   a fourth light source section which has a plurality of fourth light emitting elements arranged in a row along the second direction, and which is configured to emit a fourth light flux;
   a third reflecting member configured to reflect the fourth light flux toward a direction crossing an emission direction of the fourth light flux and the second direction; and
   a fourth reflecting member configured to reflect the fourth light flux reflected by the third reflecting member toward an emission direction of the third light flux, wherein
   the fourth light flux reflected by the fourth reflecting member is light polarized in the second polarization direction with respect to the polarization combining element,
   the third reflecting member and the fourth reflecting member are disposed so that a distance between the third light flux and the fourth light flux becomes smaller after incidence to the third reflecting member and the fourth reflecting member than before the incidence, and
   the polarization combining element combines the first light flux, the second light flux reflected by the second reflecting member, the third light flux, and the fourth light flux reflected by the fourth reflecting member with each other.

4. The light source device according to claim 2, further comprising:
   a fourth light source section which has a plurality of fourth light emitting elements arranged in a row along the second direction, and which is configured to emit a fourth light flux;
   a third reflecting member configured to reflect the fourth light flux toward a direction crossing an emission direction of the fourth light flux and the second direction; and
   a fourth reflecting member configured to reflect the fourth light flux reflected by the third reflecting member toward an emission direction of the third light flux, wherein
   the fourth light flux reflected by the fourth reflecting member is light polarized in the second polarization direction with respect to the polarization combining element, the third reflecting member and the fourth reflecting member are disposed so that a distance between the third light flux and the fourth light flux becomes smaller after incidence to the third reflecting member and the fourth reflecting member than before the incidence, and the polarization combining element combines the first light flux, the second light flux reflected by the second reflecting member, the third light flux, and the fourth light flux reflected by the fourth reflecting member with each other.

5. An illumination device comprising:
the light source device according to claim 1;
a wavelength conversion element configured to perform wavelength conversion on the light from the light source device; and
a reflecting member configured to reflect the light from the light source device toward the wavelength conversion element, wherein
the reflecting member is disposed on a light path of light emitted from the wavelength conversion element.

6. A projector comprising:
the illumination device according to claim 5;
a light modulation device configured to modulate the light from the illumination device in accordance with image information; and
a projection optical device configured to project the light modulated by the light modulation device.

7. The light source device according to claim 1, wherein the polarization combining element is a single optical element.

8. A light source device comprising:
a first light source section which has a plurality of first light emitting elements arranged in a row along a first direction, and which is configured to emit a first light flux;
a second light source section which has a plurality of second light emitting elements arranged in a row along the first direction, and which is configured to emit a second light flux;
a third light source section which has a plurality of third light emitting elements arranged in a row along a second direction crossing the first direction, and which is configured to emit a third light flux;
a fourth light source section which has a plurality of fourth light emitting elements arranged in a row along the second direction, and which is configured to emit a fourth light flux;
a first reflecting member configured to reflect the second light flux toward a direction crossing an emission direction of the second light flux and the first direction;
a second reflecting member configured to reflect the second light flux reflected by the first reflecting member toward an emission direction of the first light flux;
a third reflecting member configured to reflect the fourth light flux toward a direction crossing an emission direction of the fourth light flux and the second direction;
a fourth reflecting member configured to reflect the fourth light flux reflected by the third reflecting member toward an emission direction of the third light flux; and
a polarization combining element which the first light flux, the second light flux reflected by the second reflecting member, the third light flux, and the fourth light flux by the fourth reflecting member enter, which is configured to reflect one of the first light flux and the second light flux reflected by the second reflecting member, and the third light flux and the fourth light flux by the fourth reflecting member, and which is configured to transmit another of the first light flux and the second light flux reflected by the second reflecting member, and the third light flux and the fourth light flux by the fourth reflecting member, wherein with respect to the polarization combining element, the first light flux and the second light flux reflected by the second reflecting member are light polarized in a first polarization direction, and the third light flux and the fourth light flux are light polarized in a second polarization direction different from the first polarization direction, the first reflecting member and the second reflecting member are disposed so that a distance between the first light flux and the second light flux becomes smaller after incidence to the first reflecting member and the second reflecting member than before the incidence, the third reflecting member and the fourth reflecting member are disposed so that a distance between the third light flux and the fourth light flux becomes smaller after incidence to the third reflecting member and the fourth reflecting member than before the incidence, and the polarization combining element combines the first light flux, the second light flux reflected by the second reflecting member, the third light flux, and the fourth light flux by the fourth reflecting member with each other.

9. The light source device according to claim 8, wherein a position of a set of the first light flux and the second light flux is different by 90 degrees from a position of a set of the third light flux and the fourth light flux in circumferential direction with respect to an illumination light axis of combined light with the first, second, third and fourth light fluxes.

10. The light source device according to claim 8, wherein in the polarization combining element, the first light flux and the second light flux are separated from each other across an illumination light axis of combined light with the first, second, third and fourth light fluxes, and the third light flux and the fourth light flux are separated from each other across the illumination light axis, and
in the polarization combining element, the first light flux overlaps a part of the third light flux and a part of the fourth light flux, and the second light flux overlaps another part of the third light flux and another part of the fourth light flux.

11. The light source device according to claim 8, wherein the polarization combining element is a single optical element.

12. An illumination device comprising:
the light source device according to claim 8;
a wavelength conversion element configured to perform wavelength conversion on the light from the light source device; and
a reflecting member configured to reflect the light from the light source device toward the wavelength conversion element, wherein
the reflecting member is disposed on a light path of light emitted from the wavelength conversion element.

13. A projector comprising:
the illumination device according to claim 12;
a light modulation device configured to modulate the light from the illumination device in accordance with image information; and a projection optical device configured to project the light modulated by the light modulation device.

14. An illumination device comprising:
a first light source section which has a plurality of first light emitting elements arranged in a row along a first direction, and which is configured to emit a first light flux;
a second light source section which has a plurality of second light emitting elements arranged in a row along the first direction, and which is configured to emit a second light flux;
a third light source section which has a plurality of third light emitting elements arranged in a row along a second direction crossing the first direction, and which is configured to emit a third light flux;
a first reflecting member configured to reflect the second light flux toward a direction crossing an emission direction of the second light flux and the first direction;
a second reflecting member configured to reflect the second light flux reflected by the first reflecting member toward an emission direction of the first light flux;
a polarization combining element which the first light flux, the second light flux reflected by the second reflecting member, and the third light flux enter, which is configured to reflect one of the first light flux and the second light flux reflected by the second reflecting member, and the third light flux, and which is configured to transmit another of the first light flux and the second light flux reflected by the second reflecting member, and the third light flux;
a wavelength conversion element configured to perform wavelength conversion on light emitted from the polarization combining element; and
a reflecting member configured to reflect the light from the polarization combining element toward the wavelength conversion element, the reflecting member being disposed on a light path of light emitted from the wavelength conversion element, wherein
with respect to the polarization combining element, the first light flux and the second light flux reflected by the second reflecting member are light polarized in a first polarization direction, and the third light flux is light polarized in a second polarization direction different from the first polarization direction,
the first reflecting member and the second reflecting member are disposed so that a distance between the first light flux and the second light flux becomes smaller after incidence to the first reflecting member and the second reflecting member than before the incidence, and
the polarization combining element combines the first light flux, the second light flux reflected by the second reflecting member, and the third light flux with each other.

15. A projector comprising:
a first light source section which has a plurality of first light emitting elements arranged in a row along a first direction, and which is configured to emit a first light flux;
a second light source section which has a plurality of second light emitting elements arranged in a row along the first direction, and which is configured to emit a second light flux;
a third light source section which has a plurality of third light emitting elements arranged in a row along a second direction crossing the first direction, and which is configured to emit a third light flux;
a first reflecting member configured to reflect the second light flux toward a direction crossing an emission direction of the second light flux and the first direction;
a second reflecting member configured to reflect the second light flux reflected by the first reflecting member toward an emission direction of the first light flux;
a polarization combining element which the first light flux, the second light flux reflected by the second reflecting member, and the third light flux enter, which is configured to reflect one of the first light flux and the second light flux reflected by the second reflecting member, and the third light flux, and which is configured to transmit another of the first light flux and the second light flux reflected by the second reflecting member, and the third light flux;
a wavelength conversion element configured to perform wavelength conversion on light emitted from the polarization combining element;
a reflecting member configured to reflect the light from the polarization combining element toward the wavelength conversion element, the reflecting member being disposed on a light path of light emitted from the wavelength conversion element,
a light modulation device configured to modulate the light from the wavelength conversion element in accordance with image information; and
a projection optical device configured to project the light modulated by the light modulation device, wherein
with respect to the polarization combining element, the first light flux and the second light flux reflected by the second reflecting member are light polarized in a first polarization direction, and the third light flux is light polarized in a second polarization direction different from the first polarization direction,
the first reflecting member and the second reflecting member are disposed so that a distance between the first light flux and the second light flux becomes smaller after incidence to the first reflecting member and the second reflecting member than before the incidence, and
the polarization combining element combines the first light flux, the second light flux reflected by the second reflecting member, and the third light flux with each other.

* * * * *